(12) United States Patent
Oguro

(10) Patent No.: US 6,549,417 B1
(45) Date of Patent: Apr. 15, 2003

(54) INFORMATION PROCESSING APPARATUS

(75) Inventor: Masaki Oguro, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/496,933

(22) Filed: Feb. 2, 2000

(30) Foreign Application Priority Data

Feb. 16, 1999 (JP) .......................................... 11-037365

(51) Int. Cl.[7] .............................................. H04M 1/00
(52) U.S. Cl. ...................................... 361/730; 361/684
(58) Field of Search ................... 379/433.09; 455/300; 235/486; 312/8.12, 9.1; 361/683, 684, 685, 730, 752

(56) References Cited

U.S. PATENT DOCUMENTS

| 5,061,845 A | * | 10/1991 | Pinnavaia | 235/492 |
|---|---|---|---|---|
| 5,583,379 A | * | 12/1996 | Uwabo et al. | 361/685 |
| 5,583,745 A | | 12/1996 | Uwabo et al. | 361/685 |
| 5,634,805 A | * | 6/1997 | Saito et al. | 439/159 |
| 5,674,040 A | * | 10/1997 | Takemora | 439/159 |
| 5,815,379 A | * | 9/1998 | Mundt | 361/683 |
| 5,889,649 A | * | 3/1999 | Nabetani et al. | 361/684 |
| 6,069,793 A | * | 5/2000 | Maruyama et al. | 361/687 |
| 2002/0027602 A1 | * | 3/2002 | Ejima et al. | 348/232 |

* cited by examiner

*Primary Examiner*—Jack Chiang
*Assistant Examiner*—Quynh Nguyen
(74) *Attorney, Agent, or Firm*—Oblon, Spivak, McClelland, Maier & Neustadt, P.C.

(57) ABSTRACT

A signal conversion apparatus having a memory-stick connector for mounting a memory stick, a PC-card connector for mounting a PC card, and a cover for shielding and exposing the memory-stick connector and the PC-card connector from and to the external world. The cover has an opening for allowing a memory stick to be removed from or mounted on the memory-stick connector with the cover put in a state of shielding the memory-stick connector and the PC-card connector from the external world. As a result, it is possible to prevent the wrong storage medium from being removed from or mounted on the signal conversion apparatus.

6 Claims, 15 Drawing Sheets

F I G. 5
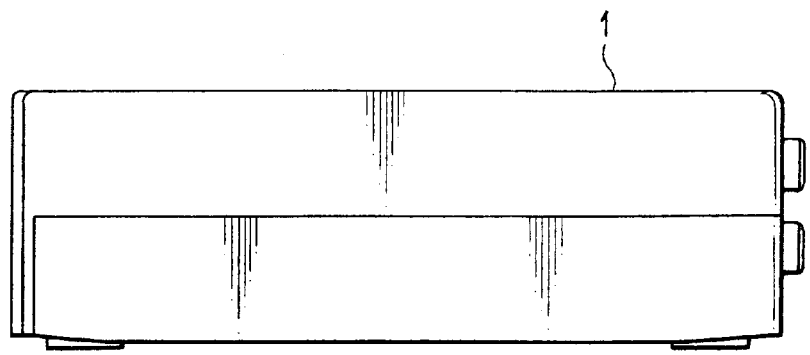
F I G. 6
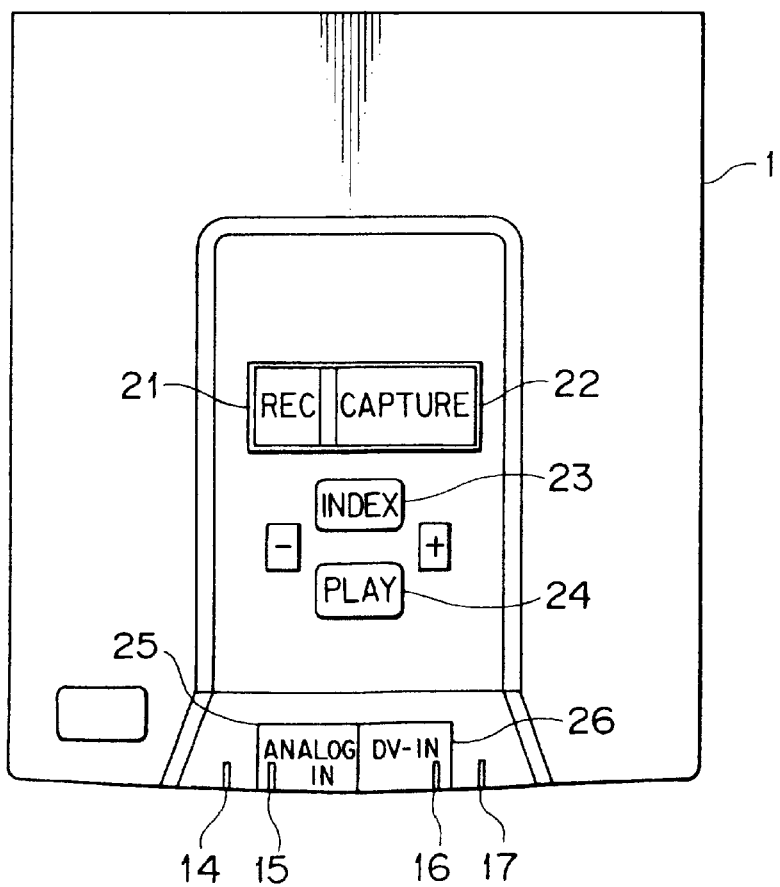

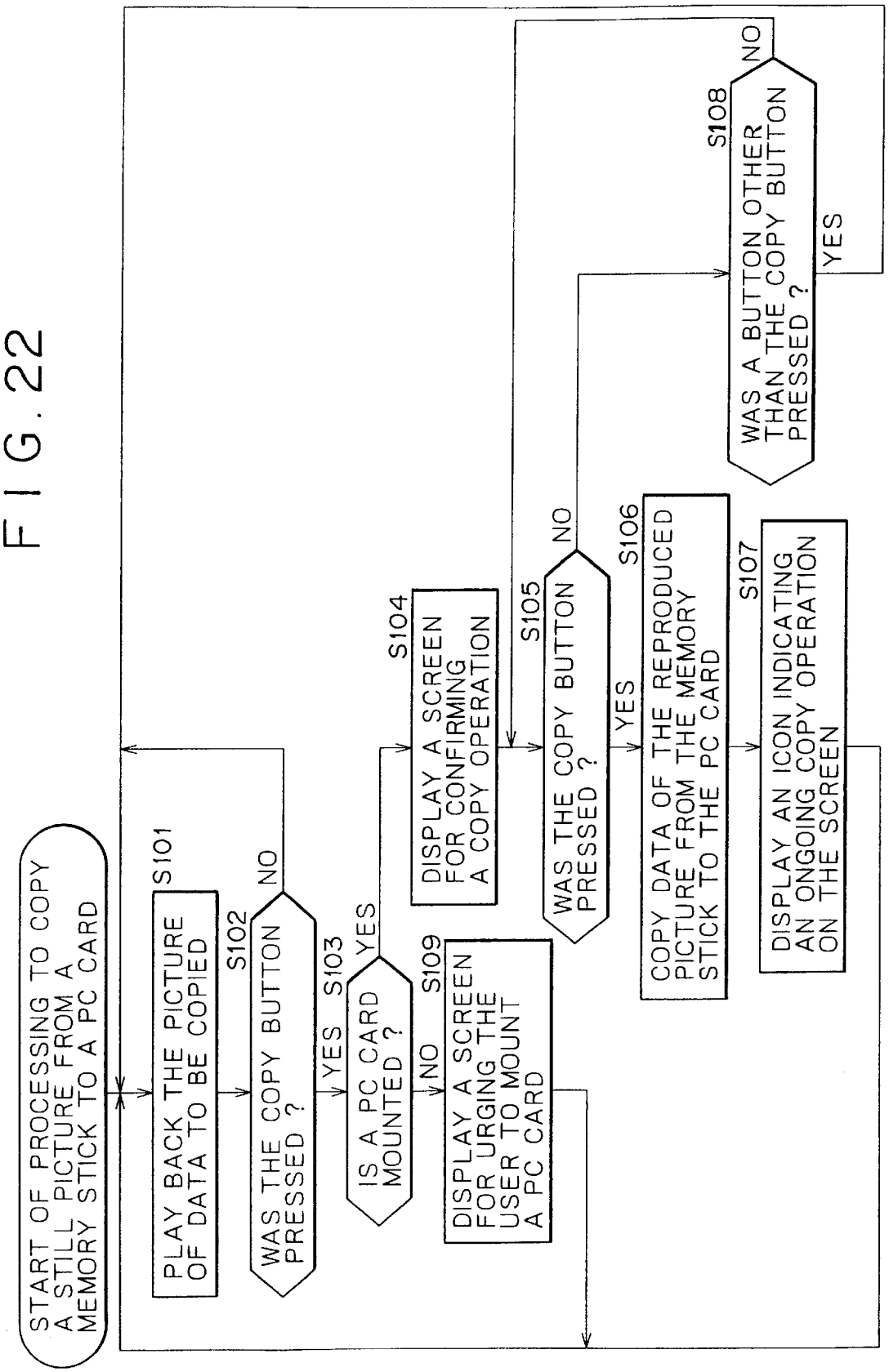

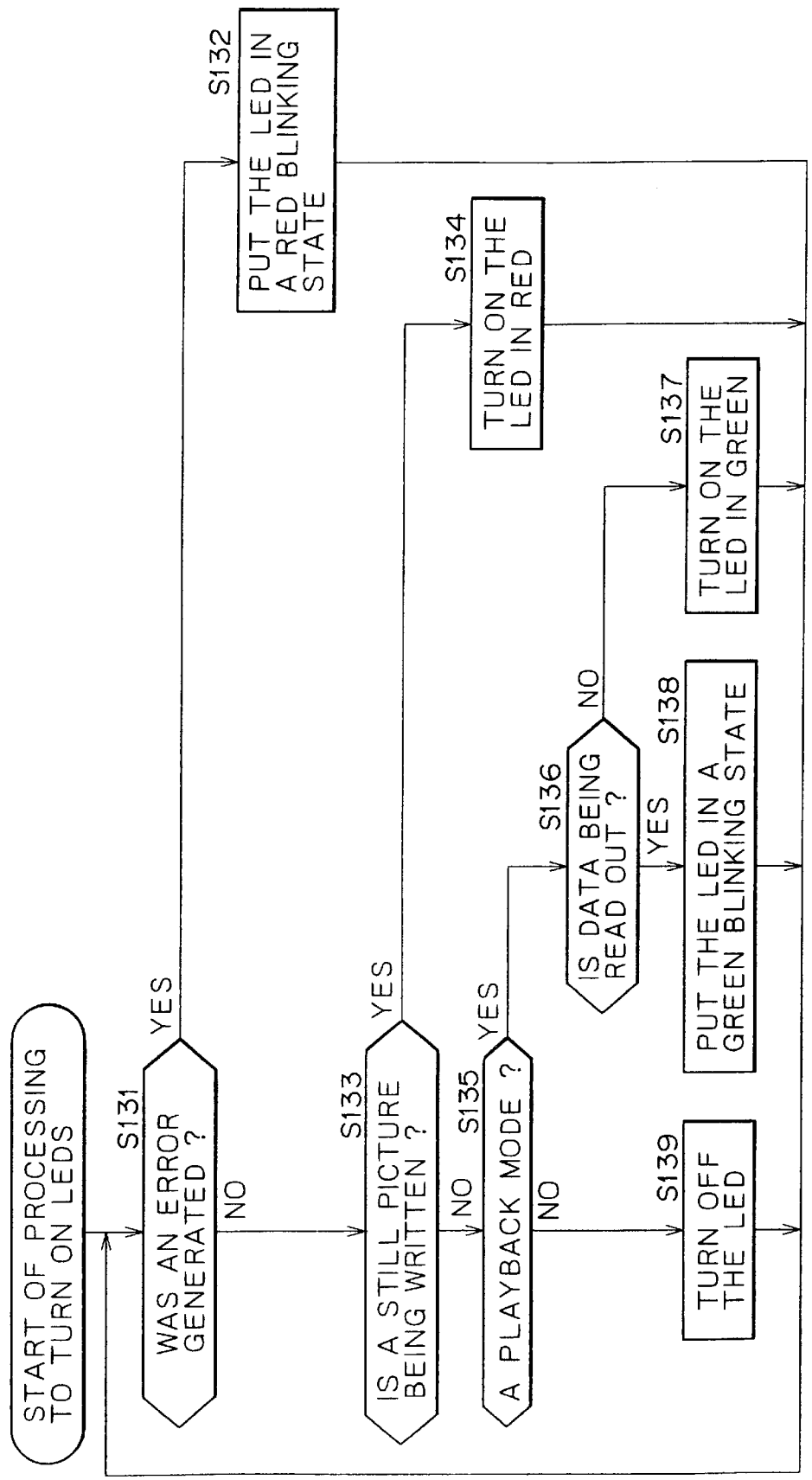

INFORMATION PROCESSING APPARATUS

BACKGROUND OF THE INVENTION

In general, the present invention relates to an information processing apparatus. More particularly, the present invention relates to an information processing apparatus which allows a plurality of storage media to be mounted thereon and stores and reads out data into and from any of the storage media.

There have been used information processing apparatuses such as a digital camera, a personal computer and an automatic answering telephone on which a plurality of recording media such as a PC card, a flash memory and a memory stick (trademark) can be mounted. The storage media mounted on the information processing apparatus are each used for storing information such as a picture and audio data. Information stored in a storage medium such as a picture and audio data is played back for use by an information processing apparatus such as a digital camera used for accumulating such information or by another information processing apparatus such as a personal computer.

A PC card mounted on an automatic answering telephone is used for storing a voice urging a caller to leave a message. On the other hand, a memory stick mounted on such a telephone is used for recording a message coming from a caller. A memory stick containing a message given by a caller is removed from the telephone and then mounted on typically an information processing apparatus such as a personal computer for playing back the message.

A PC card mounted on a digital camera which also accommodates a memory stick is used for storing all pictures taken by the digital camera. When the pictures taken by the digital camera are played back by using another information processing apparatus such as a personal computer, the picture data is copied from the PC card to the memory stick. The memory stick containing the copied picture data is then removed from the digital camera and mounted on a personal computer for reading out and playing back the picture data from the memory stick.

In the case of an information processing apparatus accommodating a plurality of storage media, however, the user will have difficulty to select which medium is to be mounted on or removed from the apparatus. In some cases, the user mounts or removes a wrong storage medium on or from the information processing apparatus.

SUMMARY OF THE INVENTION

It is thus an object of the information processing apparatus addressing the problem described above to provide an information processing apparatus accommodating a plurality of storage media wherein it is easy for the user to determine which medium is to be mounted on or removed from the apparatus and the user hardly mounts or removes a wrong medium on or from the apparatus.

BRIEF DESCRIPTION OF THE DRAWINGS

FIG. 5 is a diagram showing a right-side view of the signal conversion apparatus with the cover thereof closed;

FIG. 6 is a diagram showing a top view of the signal conversion apparatus;

FIG. 22 shows a flowchart representing processing carried out by the signal conversion apparatus to copy a still picture from a memory stick to a PC card; and FIG. 23 shows a flowchart representing processing to turn on an LED indicating the state of a memory stick mounted on the memory-stick connector.

DETAILED DESCRIPTION OF THE PREFERRED EMBODIMENTS

Figure 1:
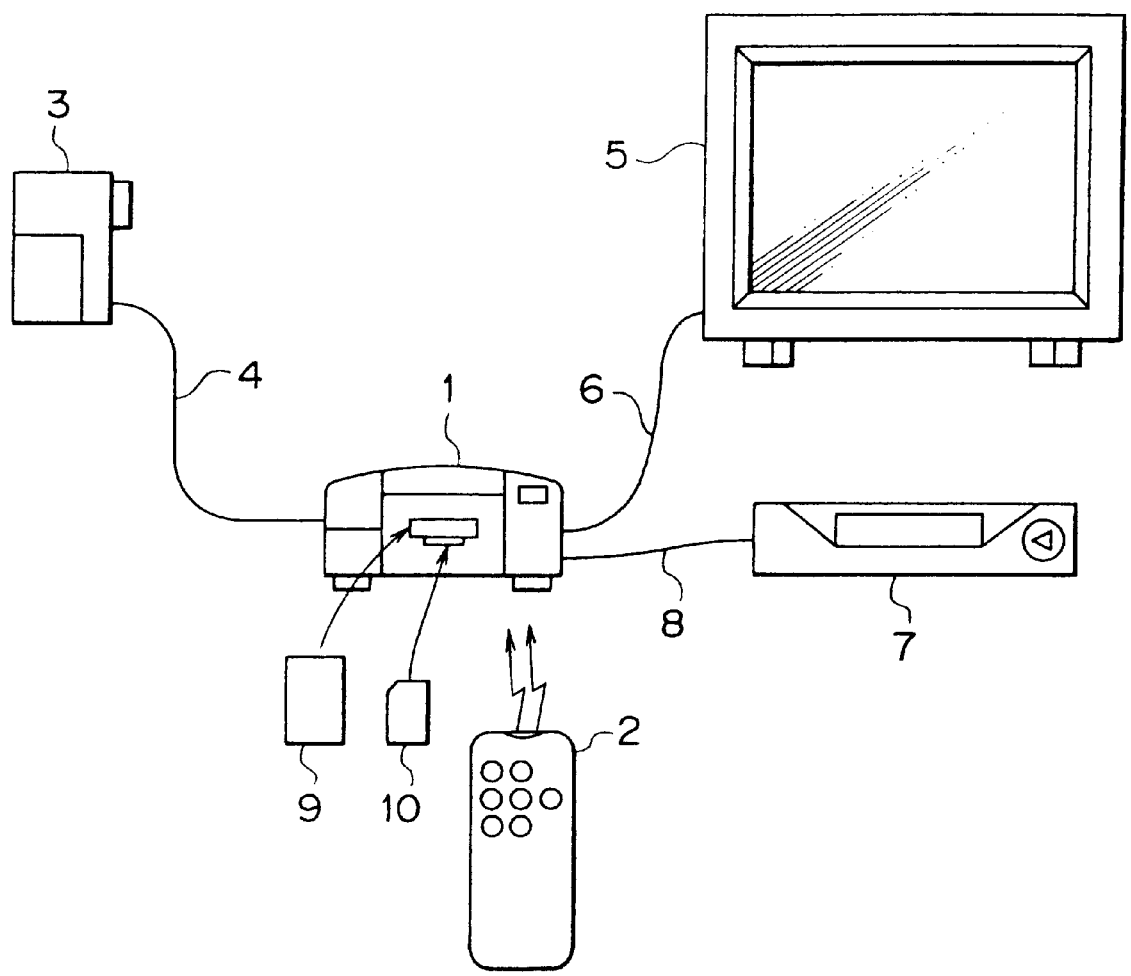
FIG. 1 is a diagram showing an embodiment implementing a signal conversion apparatus provided by the present invention.

FIG. 1 is a diagram showing an embodiment implementing a signal conversion apparatus 1 provided by the present invention. The signal conversion apparatus 1 is remotely controlled by a remote controller 2. The signal conversion apparatus 1 is connected to a digital VTR (Video Tape Recorder) 3 of the video-camera integration type by an IEEE (Institute of Electrical and Electronics Engineers)-1394 serial bus 4. The signal conversion apparatus 1 outputs digital video data of a DV-VCR (Digital Video-Video Cassette Recorder) format to the digital VTR 3 by way of the IEEE1394 serial bus 4 and inputs digital video data of the DV-VCR format from the digital VTR 3. That is to say, the digital interface between the signal conversion apparatus 1 and the digital VTR 3 conforms to the IEEE1394 standards.

The signal conversion apparatus 1 outputs an analog video signal to a monitor 5 by way of a cable 6 and inputs an analog video signal from a VTR 7 by way of a cable 8.

The signal conversion apparatus 1 converts digital video data received from the digital VTR 3 into an analog video signal output to the monitor 5. On the other hand, the signal conversion apparatus 1 converts an analog video signal received from the VTR 7 into digital video data output to the digital VTR 3. In addition, the signal conversion apparatus 1 passes on an analog video signal received from the VTR 7 to the monitor 5 as it is.

The signal conversion apparatus 1 allows a PC card 9 including a predetermined embedded memory or a memory stick 10 to be mounted thereon. The signal conversion apparatus 1 converts input digital video data or an analog video signal into a still picture and stores the still picture into the PC card 9 or the memory stick 10 in accordance with a predetermined operation carried out by the user.

The signal conversion apparatus 1 converts a still picture stored in the PC card 9 or the memory stick 10 into an analog video signal output to the monitor 5. Likewise, the signal conversion apparatus 1 converts a still picture stored in the PC card 9 or the memory stick 10 into digital video data output to the digital VTR 3.

In addition, the signal conversion apparatus 1 copies a still picture stored in the PC card 9 to the memory stick 10 in accordance with a predetermined operation carried out by the user. By the same token, the signal conversion apparatus 1 copies a still picture to the PC card 9 from the memory stick 10 in accordance with a predetermined operation carried out by the user.

The description of audio processing of the signal conversion apparatus 1 is omitted.

Figure 2:
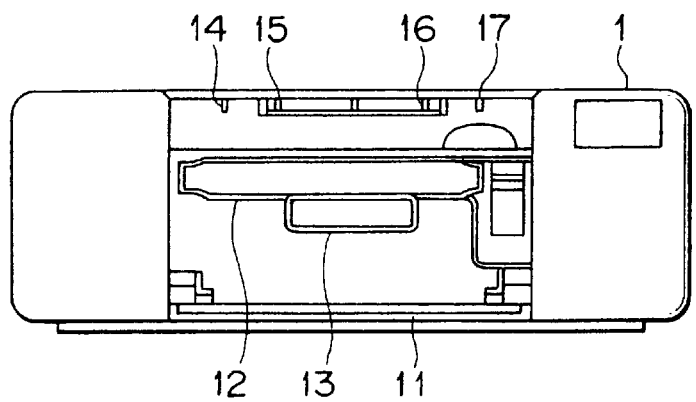
FIG. 2 is a diagram showing a front view of the signal conversion apparatus with a cover thereof opened.
Figure 3:
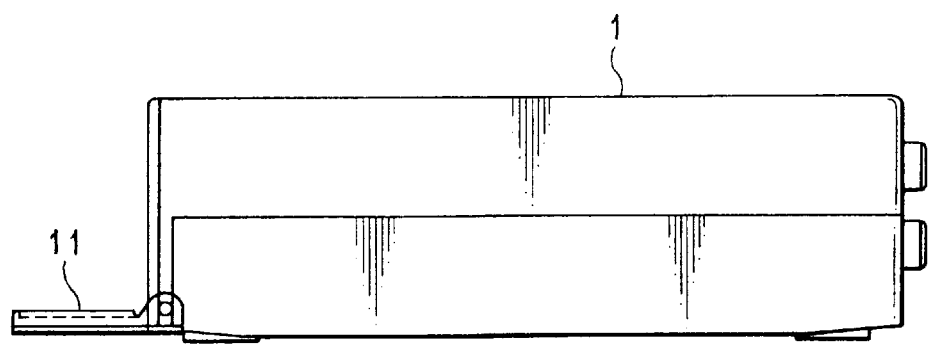
FIG. 3 is a diagram showing a right-side view of the signal conversion apparatus with the cover thereof opened.

FIG. 2 is a diagram showing a front view of the signal conversion apparatus 1 with a cover 11 thereof opened. FIG. 3 is a diagram showing a right-side view of the signal conversion apparatus 1 with the cover 11 thereof opened. The PC card 9 including an embedded memory is mounted on the PC-card connector 12. On the other hand, the memory stick 10 is inserted into a memory-stick connector 13 to be seated thereon. If the memory stick 10 mounted on the memory-stick connector 13 is pressed against the memory-stick connector 13 again, the memory stick 10 can be taken out from it.

An LED 14 indicates status of the memory stick 10 mounted on the memory-stick connector 13. The status indicates data stored in the memory stick 10 and a generated error. When an analog video signal generated by the VTR 7 is supplied to the signal conversion apparatus 1, an LED 15 is turned on. When digital video data input from the digital VTR 3 is supplied to the signal conversion apparatus 1, on the other hand, an LED 16 is turned on. An LED 17 indicates status of the PC card 9 mounted on the PC-card connector 12. The status indicates data stored in the PC card 9 and a generated error.

Figure 4:
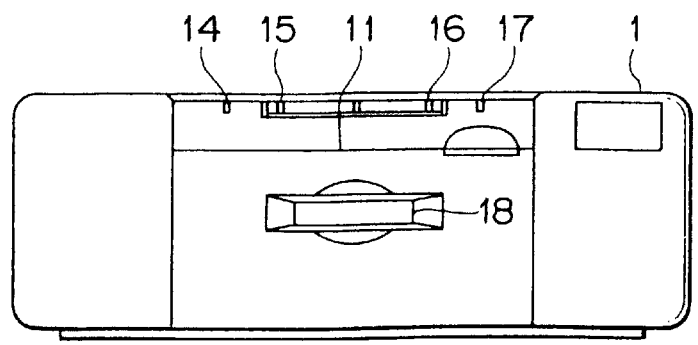
FIG. 4 is a diagram showing a front view of the signal conversion apparatus with the cover thereof closed.

FIG. 4 is a diagram showing a front view of the signal conversion apparatus 1 with the cover 11 thereof closed. FIG. 5 is a diagram showing a right-side view of the signal conversion apparatus 1 with the cover 11 thereof closed. When the cover 11 of the signal conversion apparatus 1 is closed, the PC-card connector 12 is covered or the opening of the signal conversion apparatus 1 is blocked. Thus, the user is not capable of removing the PC card 9 from the PC-card connector 12 or mounting a PC card 9 on the PC-card connector 12.

Even if the cover 11 of the signal conversion apparatus 1 is closed, however, the user is capable of removing the memory stick 10 from the memory-stick connector 13 since a hole 18 is provided through the cover 11. This is because, with a memory stick 10 seated on the memory-stick connector 13, the memory stick 10 protrudes from the memory-stick connector 13 to a position that allows the memory stick 10 to be picked by fingers. In addition, even if the cover 11 of the signal conversion apparatus 1 is closed, the hole 18 also allows a memory stick 10 to be mounted on the memory-stick connector 13 through the hole 18.

FIG. 6 is a diagram showing a top view of the signal conversion apparatus 1. On the top surface of the signal conversion apparatus 1, there are provided a recording button 21, a capture button 22, an index button 23, a playback button 24, an analog-input select button 25 and a DV-input select button 26. The recording button 21 is operated to store a still picture included in an input analog video signal or input digital video data into the memory stick 10 mounted on the memory-stick connector 13 or the PC card 9 mounted on the PC-card connector 12.

The capture button 22 is operated to halt a moving picture displayed on the monitor 5 in order to store a still picture included in an input analog video signal or input digital video data into the memory stick 10 mounted on the memory-stick connector 13 or the PC card 9 mounted on the PC-card connector 12.

The index button 23 is operated to display thumbnail pictures of a plurality of still pictures stored in the memory stick 10 mounted on the memory-stick connector 13 or the PC card 9 mounted on the PC-card connector 12 on the monitor 5.

The playback button 24 is operated to display a still picture stored in the memory stick 10 mounted on the memory-stick connector 13 or the PC card 9 mounted on the PC-card connector 12 on the monitor 5.

The analog-input select button 25 is operated to input an analog video signal supplied from the VTR 7 to the signal conversion apparatus 1. On the other hand, the DV-input select button 26 is operated to input digital video data supplied from the digital VTR 3 to the signal conversion apparatus 1.

The on and off states of the LEDs 14, 15, 16 and 17 can also be verified from the top surface of the signal conversion apparatus 1.

Figure 7:
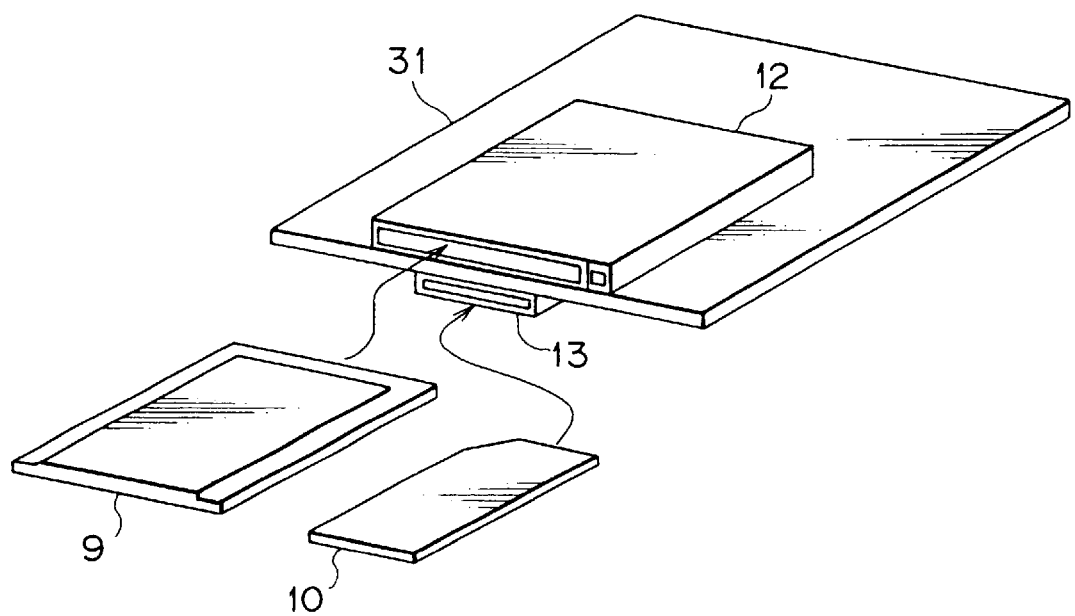
FIG. 7 is an explanatory diagram showing how a PC-card connector and a memory-stick connector are fixed on a board.

FIG. 7 is an explanatory diagram showing how the PC-card connector 12 and the memory-stick connector 13 are fixed on a board 31 on which predetermined components of the signal conversion apparatus 1 are mounted. As shown in the figure, the PC-card connector 12 is mounted on the upper-side surface of the board 31 of the signal conversion apparatus 1. On the other hand, the memory-stick connector 13 is mounted on the lower-side surface of the board 31 of the signal conversion apparatus 1. The PC-card connector 12 has an opening into which a PC card 9 is inserted in order to mount the PC card 9 on the PC-card connector 12. By the same token, the memory-stick connector 13 has an opening into which a memory stick 10 is inserted in order to mount the memory stick 10 on the memory-stick connector 13. The PC-card connector 12 and the memory-stick connector 13 are oriented in such a way that their openings are placed on the same side and the horizontal centers of the openings all but coincide with each other.

By fixing the PC-card connector 12 and the memory-stick connector 13 on the board 31 in such a way that their openings are placed on the same side and the horizontal centers of the openings all but coincide with each other in this way, the areas required for fixing the PC-card connector 12 and the memory-stick connector 13 on the board 31 are small, making it possible to make the signal conversion apparatus 1 small in size.

Figure 8:
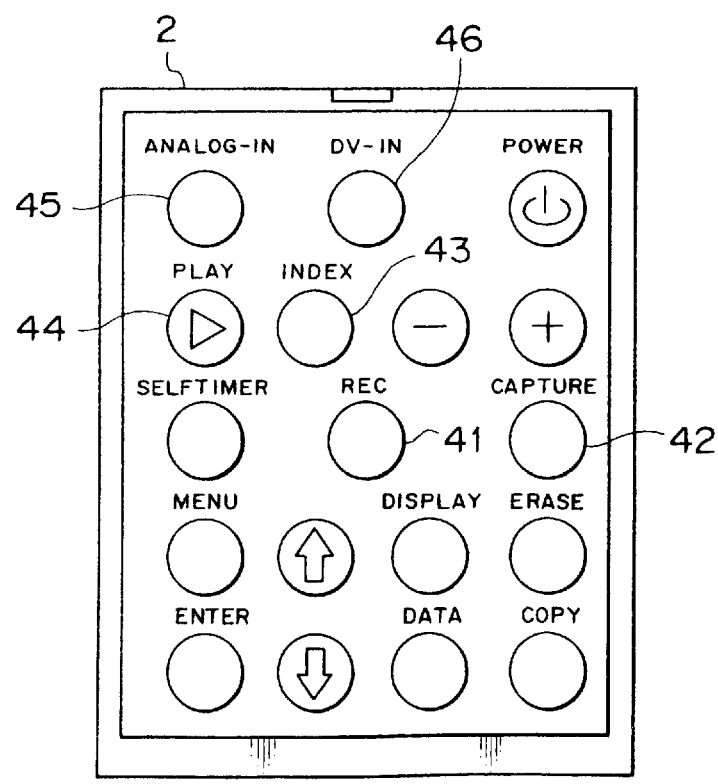
FIG. 8 is an explanatory diagram showing an external view of a remote controller.

FIG. 8 is an explanatory diagram showing an external view of the remote controller 2. As shown in the figure, the remote controller 2 has a recording button 41, a capture button 42, an index button 43, a playback button 44, an analog-input select button 45 and a DV-input select button 46. Corresponding to the recording button 21 of the signal conversion apparatus 1, the recording button 41 is operated to store a still picture included in an input analog video signal or input digital video data into the memory stick 10 mounted on the memory-stick connector 13 or the PC card 9 mounted on the PC-card connector 12.

Corresponding to the capture button 22 of the signal conversion apparatus 1, the capture button 42 is operated to halt a moving picture displayed on the monitor 5 in order to store a still picture included in an input analog video signal or input digital video data into the memory stick 10 mounted on the memory-stick connector 13 or the PC card 9 mounted on the PC-card connector 12.

Corresponding to the index button 23 of the signal conversion apparatus 1, the index button 43 is operated to display indexes of a plurality of still pictures stored in the memory stick 10 mounted on the memory-stick connector 13 or the PC card 9 mounted on the PC-card connector 12 on the monitor 5.

Corresponding to the playback button 24 of the signal conversion apparatus 1, the playback button 44 is operated to display a still picture stored in the memory stick 10 mounted on the memory-stick connector 13 or the PC card 9 mounted on the PC-card connector 12 on the monitor 5.

Corresponding to the analog-input select button 25 of the signal conversion apparatus 1, the analog-input select button 45 is operated to input an analog video signal supplied from the VTR 7 to the signal conversion apparatus 1. Corresponding to the DV-input select button 26 of the signal conversion apparatus 1, on the other hand, the DV-input select button 46 is operated to input digital video data supplied from the digital VTR 3 to the signal conversion apparatus 1.

Figure 9:
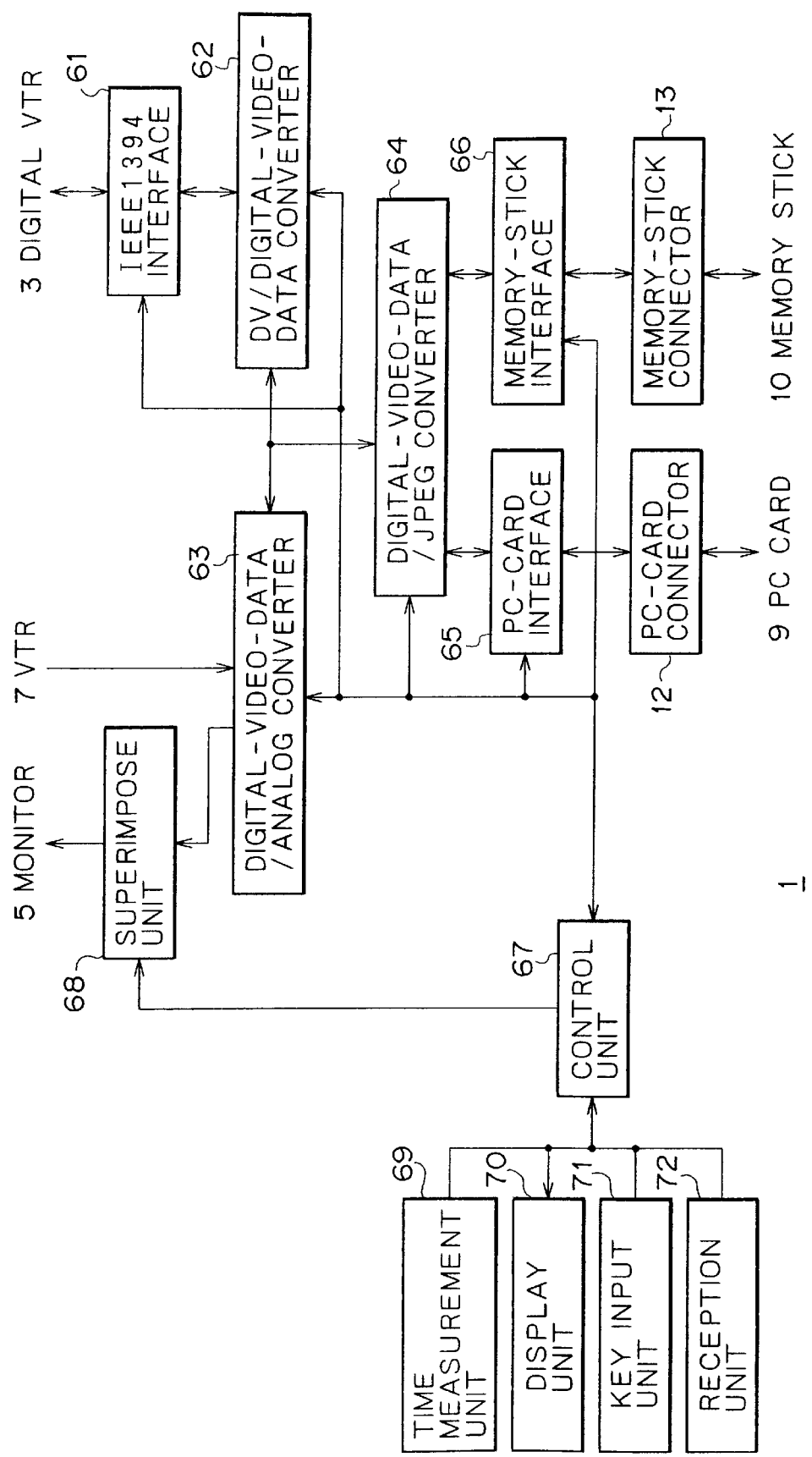
FIG. 9 is an explanatory block diagram showing the configuration of the signal conversion apparatus.

FIG. 9 is an explanatory block diagram showing the configuration of the signal conversion apparatus 1. Connected to the digital VTR 3 by an IEEE1394 serial bus 4, an IEEE1394 interface 61 is an input/output interface conforming to the IEEE1394 standards. Based on control executed by a control unit 67, the IEEE1394 interface 61 receives digital video data from the digital VTR 3 through the IEEE1394 serial bus 4, supplying the data to a DV/digital-video-data converter 62, and transmits digital video data output by the DV/digital-video-data converter 62 to the digital VTR 3 by way of the IEEE1394 serial bus 4.

Based on control executed by the control unit 67, the DV/digital-video-data converter 62 converts digital video data with a DV-VCR format, which is received by the signal conversion apparatus 1 from the digital VTR 3 and passed on by the IEEE1394 interface 61 to the DV/digital-video-data converter 62, into internal digital video data. The internal digital video data is then supplied to a digital-video-data/analog converter 63 and a digital-video-data/JPEG (Joint Photographic Experts Group) converter 64. The digital-video-data/analog converter 63 converts an analog video signal received by the signal conversion apparatus 1 from the VTR 7 into internal digital video data. The DV/digital-video-data converter 62 converts internal digital video data received from the digital-video-data/analog converter 63 into digital video data with the DV-VCR format to be supplied to the IEEE1394 interface 61.

In addition, the DV/digital-video-data converter 62 also converts internal digital video data received from the digital-video-data/JPEG converter 64 into digital video data with the DV-VCR format to be supplied to the IEEE1394 interface 61.

As described above, the DV/digital-video-data converter 62 converts digital video data with a DV-VCR format, which is received by the signal conversion apparatus 1 from the digital VTR 3 and passed on by the IEEE1394 interface 61 to the DV/digital-video-data converter 62, into internal digital video data, and the internal digital video data is then supplied to the digital-video-data/analog converter 63. Based on control executed by the control unit 67, the digital-video-data/analog converter 63 converts the internal video data received from the DV/digital-video-data converter 62 into an analog video signal which is then supplied to a superimpose unit 68. As described above, the digital-video-data/analog converter 63 converts an analog video signal received by the signal conversion apparatus 1 from the VTR 7 into internal digital video data which is supplied to the DV/digital-video-data converter 62 and the digital-video-data/JPEG converter 64.

Based on control executed by the control unit 67, the digital-video-data/JPEG converter 64 converts internal digital video data received from the DV/digital-video-data converter 62 or the digital-video-data/analog converter 63 into still picture data of the JPEG format which is then output to a PC-card interface 65 and a memory-stick interface 66. On the other hand, the digital-video-data/JPEG converter 64 converts JPEG still picture data received from the PC-card interface 65 or the memory-stick interface 66 into internal digital video data which is then supplied to the DV/digital-video-data converter 62 and the digital-video-data/analog converter 63.

Based on control executed by the control unit 67, the PC-card interface 65 stores JPEG still picture data received from the digital-video-data/JPEG converter 64 into the PC card 9 mounted on the PC-card connector 12, and reads out JPEG still picture data from the PC card 9 mounted on the PC-card connector 12, supplying the data to the digital-video-data/JPEG converter 64.

By the same token, based on control executed by the control unit 67, the memory-stick interface 66 stores JPEG still picture data received from the digital-video-data/JPEG converter 64 into the memory stick 10 mounted on the memory-stick connector 13, and reads out JPEG still picture data from the memory stick 10 mounted on the memory-stick connector 13, supplying the data to the digital-video-data/JPEG converter 64.

The control unit 67 controls the IEEE1394 interface 61, the DV/digital-video-data converter 62, the digital-video-data/analog converter 63, the digital-video-data/JPEG converter 64, the PC-card interface 65, the memory-stick interface 66, the superimpose unit 68 and a display unit 70 on the basis of a signal received from a key input unit 71 or a reception unit 72.

Based on control executed by the control unit 67, the superimpose unit 68 superposes a signal representing predetermined characters or an icon showing the state of the signal conversion apparatus 1 on an analog video signal generated by the digital-video-data/analog converter 63, outputting the analog signal and the characters or the icon to the monitor 5 by way of the cable 6.

A time measurement unit 69 supplies data representing a date and a time to the control unit 67. The display unit 70 comprises the LEDs 14, 15, 16 and 17 and an LED driving unit for driving the LEDs 14, 15, 16 and 17. Based on control executed by the control unit 67, the display unit 70 turns off the LEDs 14, 15, 16 and 17, turns on the LEDs 14, 15, 16 and 17 at predetermined colors or put the LEDs 14, 15, 16 and 17 in a blinking state.

The key input unit 71 comprises the recording button 21, the capture button 22, the index button 23, the playback button 24, the analog-input select button 25 and the DV-input select button 26. The key input unit 71 provides the control unit 67 with a signal according to an operation carried out on the recording button 21, the capture button 22, the index button 23, the playback button 24, the analog-input select button 25 and the DV-input select button 26. A reception unit 72 receives an infrared light transmitted by the remote controller 2, providing the control unit 67 with a signal according to the blinking pattern of the infrared light which is determined by an operation carried out on the recording button 41, the capture button 42, the index button 43, the playback button 44, the analog-input select button 45 and the DV-input select button 46.

Figure 10:
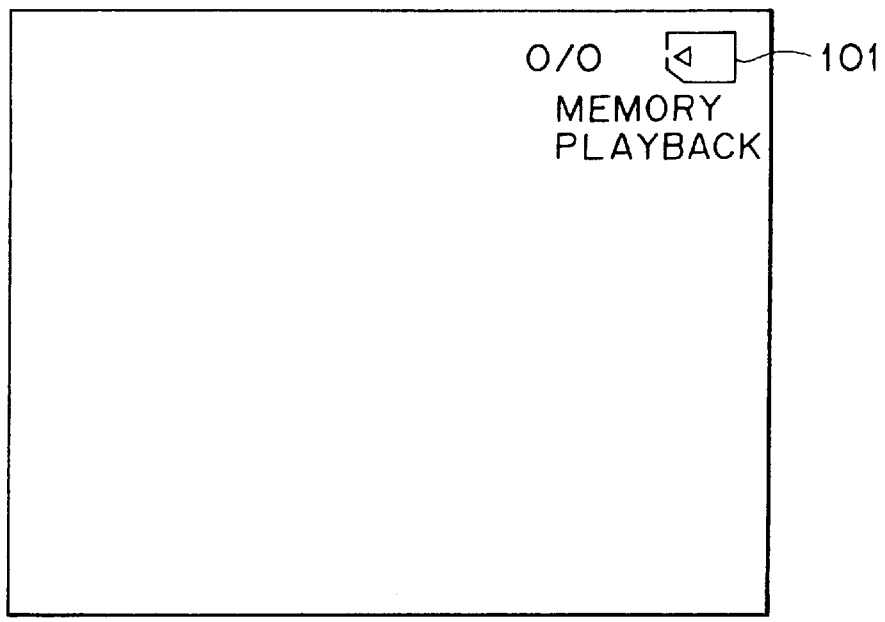
FIG. 10 is an explanatory diagram showing a typical screen displayed by the signal conversion apparatus on a monitor.

FIG. 10 is an explanatory diagram showing a typical screen which is displayed by the signal conversion apparatus 1 on the monitor 5 when a memory stick 10 containing no still picture data is mounted on the memory-stick connector 13 and the playback button 24 is pressed. The signal conversion apparatus 1 displays an icon 101 of the memory stick 10 at the upper right corner on the screen of the monitor 5. A message saying: "Memory Playback" is displayed beneath the icon 101 of the memory stick 10. A string of characters "0/0" is displayed on the left side of the icon 101 to indicate that no still picture data is stored in the memory stick 10 mounted on the memory-stick connector 13. The number on the right-hand side of the slash "/" in the string of characters is the number of still pictures stored in the memory stick 10 mounted on the memory-stick connector 13. On the other hand, the number on the left-hand side of the slash "/" in the string of characters is the order number of a still picture displayed on the screen of the monitor 5 among still pictures stored in the memory stick 10 mounted on the memory-stick connector 13. Since no still picture data is stored in the memory stick 10 mounted on the memory-stick connector 13, the number on the right-hand side of the slash "/" in the string of characters is set at "0". By the same token, since no still picture is displayed on the screen of the monitor 5, the number on the left-hand side of the slash "/" in the string of characters is set at "0" and the screen of the monitor 5 is a blue back.

Figure 11:
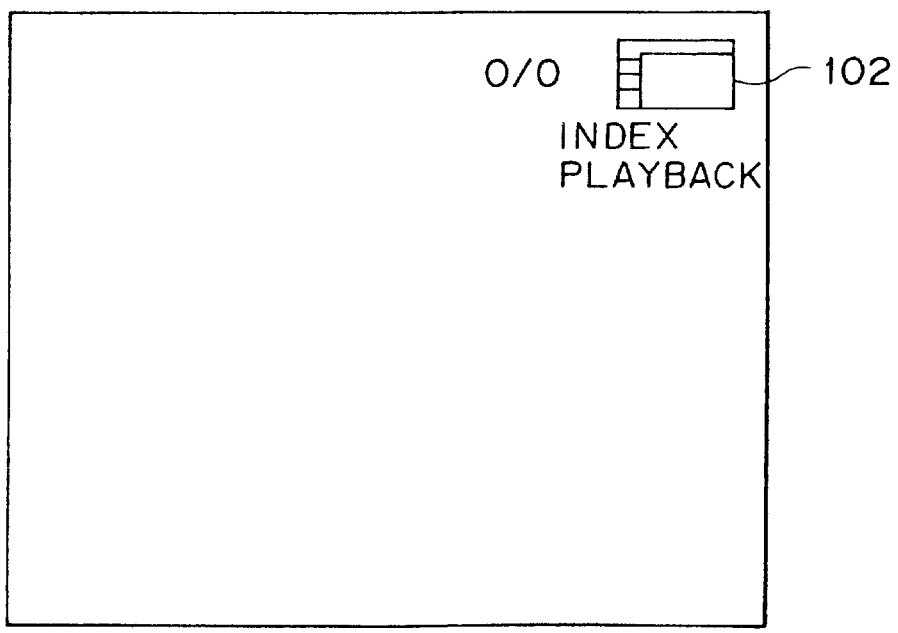
FIG. 11 is an explanatory diagram showing another typical screen displayed by the signal conversion apparatus on the monitor.

FIG. 11 is an explanatory diagram showing a typical screen which is displayed by the signal conversion apparatus 1 on the monitor 5 when a PC card 9 containing no still picture data is mounted on the PC-card connector 12 and the index button 23 is pressed. The signal conversion apparatus 1 displays an icon 102 representing the PC card 9 at the upper right corner on the screen of the monitor 5. A message saying: "Index Playback" is displayed beneath the icon 102 of the PC card 9. A string of characters "0/0" is displayed on the left side of the icon 102 to indicate that no still picture data is stored in the PC card 9 mounted on the PC-card connector 12. The numbers on the right-hand and left-hand sides of the slash "/" in the string of characters have the same meanings as those shown in FIG. 10, making it unnecessary to repeat their explanation.

Figure 12:
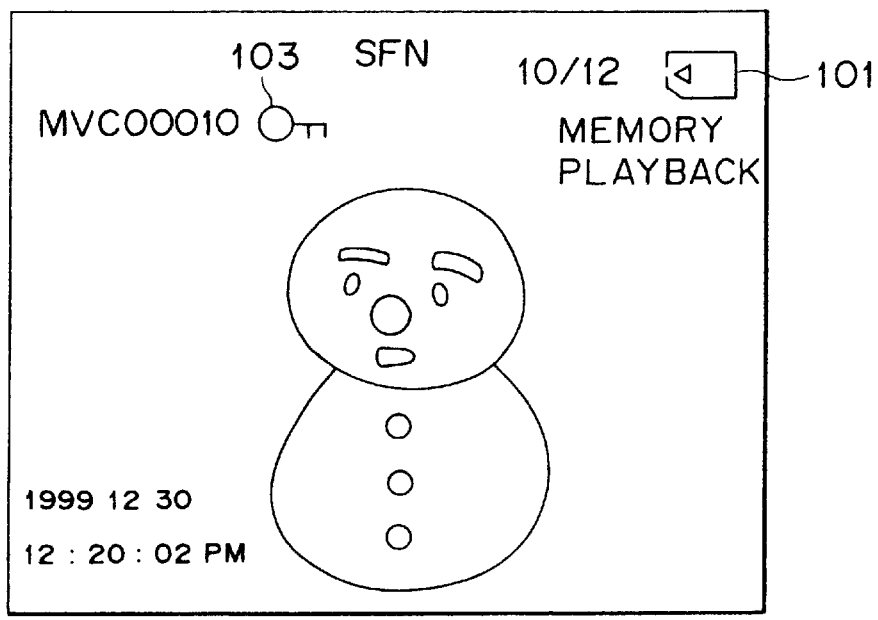
FIG. 12 is an explanatory diagram showing still another typical screen displayed by the signal conversion apparatus on the monitor.

FIG. 12 is an explanatory diagram showing a typical screen which is displayed by the signal conversion apparatus 1 on the monitor 5 when a memory stick 10 containing certain still picture data is mounted on the memory-stick connector 13 and the playback button 24 is pressed. The signal conversion apparatus 1 displays a picture stored in the memory stick 10 on the monitor 5.

Much like the screen shown in FIG. 10, the signal conversion apparatus 1 displays an icon 101 of the memory stick 10 at the upper right corner on the screen of the monitor 5 and a message saying: "Memory Playback" is displayed beneath the icon 101.

The signal conversion apparatus 1 also displays a typical string of characters "10/12" on the left side of the icon 101 of the memory stick 10 mounted on the memory-stick connector 13 on the screen of the monitor 5 to indicate that 12 still pictures are stored in the memory stick 10 and the tenth still picture is currently displayed on the screen of the monitor 5. The signal conversion apparatus 1 also displays a string of characters "SFN" representing the resolution of a picture displayed on the screen on the monitor 5 at the center of the top of the screen. In addition, the signal conversion apparatus 1 also displays the name of a file corresponding to the picture displayed on the screen of the monitor 5 on the left side of the top of the screen. Furthermore, the signal conversion apparatus 1 also displays an icon 103 on the left side of the top of the screen on the monitor 5 to indicate that the file corresponding to the picture displayed on the screen can not be deleted.

Moreover, the signal conversion apparatus 1 also displays a date and a time, at which the still picture data was stored in the memory stick 10, on the left side of the bottom of the screen on the monitor 5. It should be noted, however, that the signal conversion apparatus 1 can also be set so that such a date and a time are not displayed.

Figure 13:
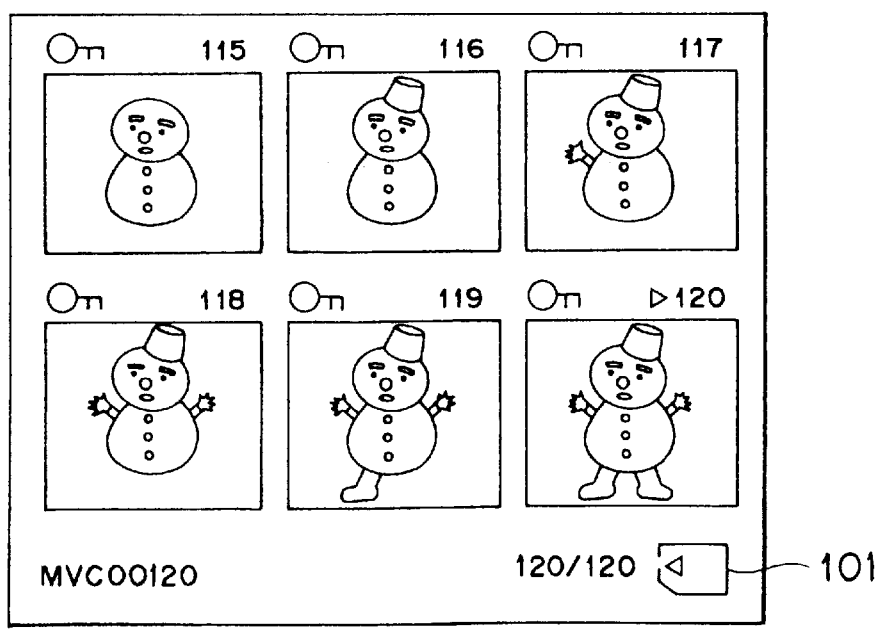
FIG. 13 is an explanatory diagram showing a further typical screen displayed by the signal conversion apparatus on the monitor.

FIG. 13 is an explanatory diagram showing a typical screen which is displayed by the signal conversion apparatus 1 on the monitor 5 when a memory stick 10 containing certain still picture data is mounted on the memory-stick connector 13 and the index button 23 is pressed. The signal conversion apparatus 1 generates a predetermined number of thumbnail pictures from the pictures stored in the memory stick 10 and displays the thumbnail pictures on the screen of the monitor 5 along with the names of the files corresponding to the thumbnail pictures. In addition, the signal conversion apparatus 1 also displays the icon 101 of the memory stick 10 on the right side of the bottom of the screen on the monitor 5.

The signal conversion apparatus 1 also displays a typical string of characters "120/120" on the left side of the icon 101 of the memory stick 10 mounted on the memory-stick connector 13 on the screen of the monitor 5 to indicate that 120 still pictures are stored in the memory stick 10 and the last thumbnail picture currently displayed on the screen of the monitor 5 corresponds to the 120th still picture stored in the memory stick 10. The last thumbnail picture displayed on the screen of the monitor 5 is a thumbnail picture with the largest file-name number. In addition, the signal conversion apparatus 1 also displays the name of a file corresponding to the last picture stored in the memory stick 10 on the left side of the bottom of the screen of the monitor 5.

Figure 14:
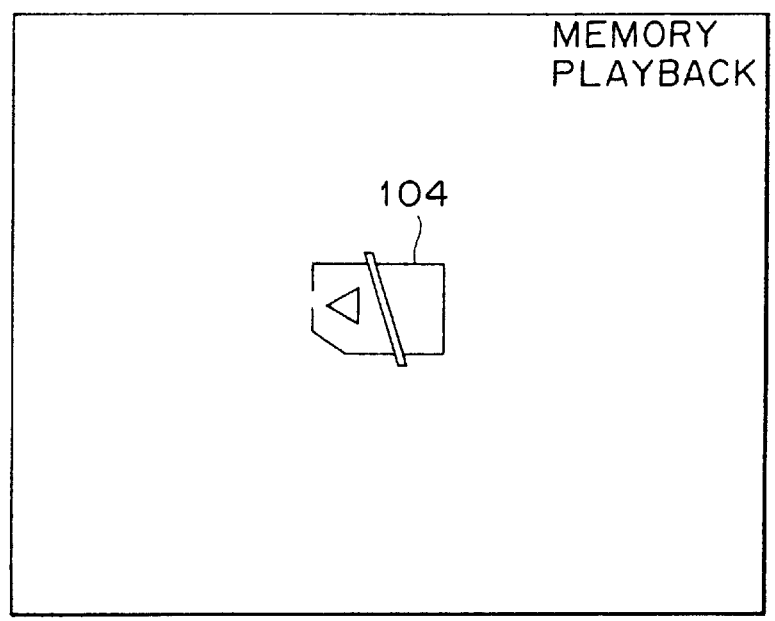
FIG. 14 is an explanatory diagram showing a still further typical screen displayed by the signal conversion apparatus on the monitor.

FIG. 14 is an explanatory diagram showing a typical screen which is displayed by the signal conversion apparatus 1 on the monitor 5 when a memory stick 10 containing certain still picture data currently mounted on the memory-stick connector 13 to play back a picture is pulled out from the memory-stick connector 13. The signal conversion apparatus 1 also displays an icon 104 indicating that the memory stick 10 has been removed from the memory-stick connector 13 at the center of the screen of the monitor 5.

Figure 15:
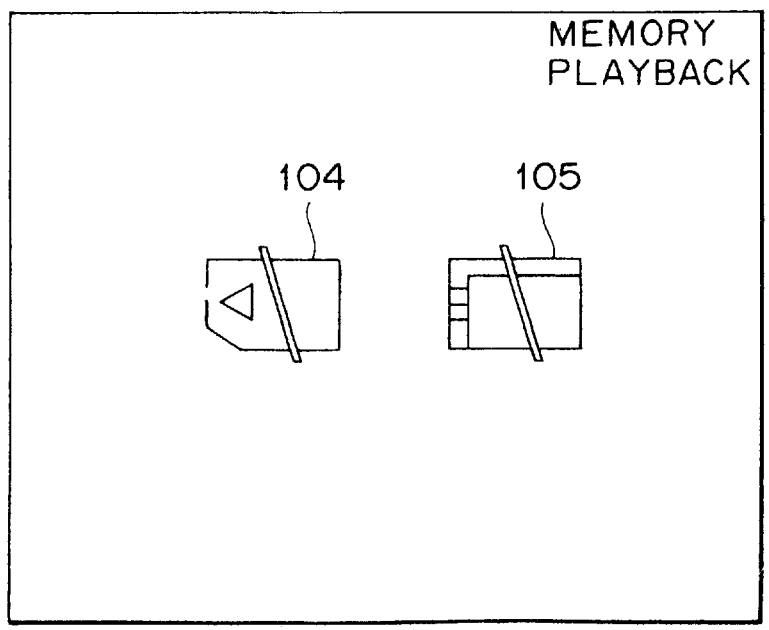
FIG. 15 is an explanatory diagram showing a still further typical screen displayed by the signal conversion apparatus on the monitor.

FIG. 15 is an explanatory diagram showing a typical screen which is displayed by the signal conversion apparatus 1 on the monitor 5 when a memory stick 10 containing certain still picture data currently mounted on the memory-stick connector 13 and a PC card 9 containing certain still picture data currently mounted on the PC-card connector 12 to play back a picture of the memory stick 10 and the PC card 9 are pulled out from the memory-stick connector 13 and the PC-card connector 12, respectively. The signal conversion apparatus 1 also displays an icon 104 indicating that the memory stick 10 has been removed from the memory-stick connector 13 and an icon 105 indicating that the PC card 9 has been removed from the PC-card connector 12 at the center of the screen of the monitor 5.

Figure 16:
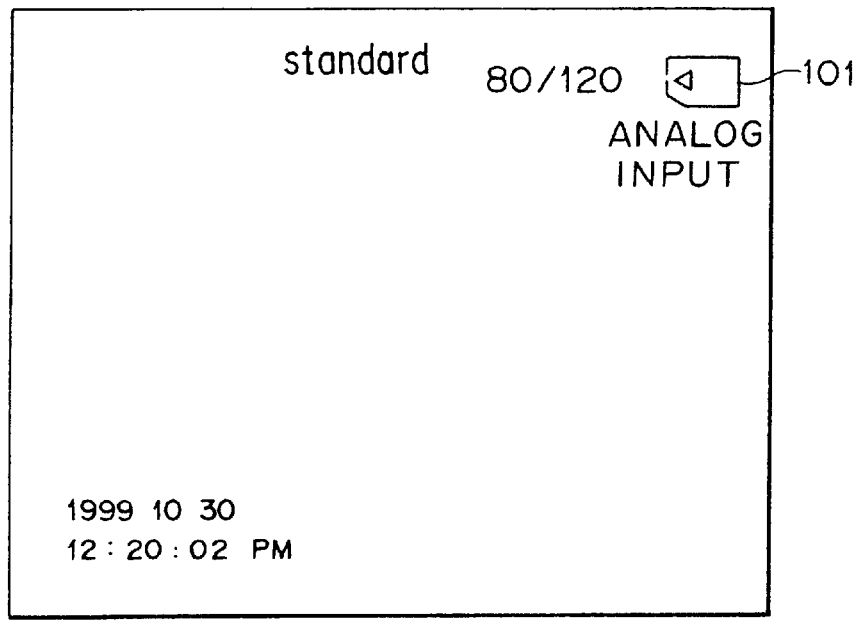
FIG. 16 is an explanatory diagram showing a still further typical screen displayed by the signal conversion apparatus on the monitor.

FIG. 16 is an explanatory diagram showing a typical screen which is displayed by the signal conversion apparatus 1 on the monitor 5 when the recording button 21 is pressed to store data of a still picture included in an analog video signal into a memory stick 10 mounted on the memory-stick connector 13. In addition, the signal conversion apparatus 1 also displays the icon 101 of the memory stick 10 on the right side of the top of the screen on the monitor 5 and a message saying: "Analog Input" is displayed beneath the icon 101.

The signal conversion apparatus 1 also displays a typical string of characters "180/120" on the left side of the icon 101 of the memory stick 10 on the screen of the monitor 5 to indicate a picture storing state of the memory stick 10 mounted on the memory-stick connector 13. To be more specific, the number 120 on the right-hand side of the slash "/" means that a maximum of 120 still pictures generated at a predetermined compression factor can be stored in the memory stick 10 mounted on the memory-stick connector 13. The number 80 on the left-hand side of the slash "/" means that the 80th still picture is currently being stored in the memory stick 10 mounted on the memory-stick connector 13. The signal conversion apparatus 1 also displays a string of characters "Standard" indicating a typical compression factor of the still picture at the center of the top of the screen of the monitor 5.

Moreover, the signal conversion apparatus 1 also displays a date and a time, at which a file of the still picture data was stored in the memory stick 10, on the left side of the bottom of the screen on the monitor 5. It should be noted, however, that the signal conversion apparatus 1 can also be set so that such a date and a time are not displayed.

Figure 17:
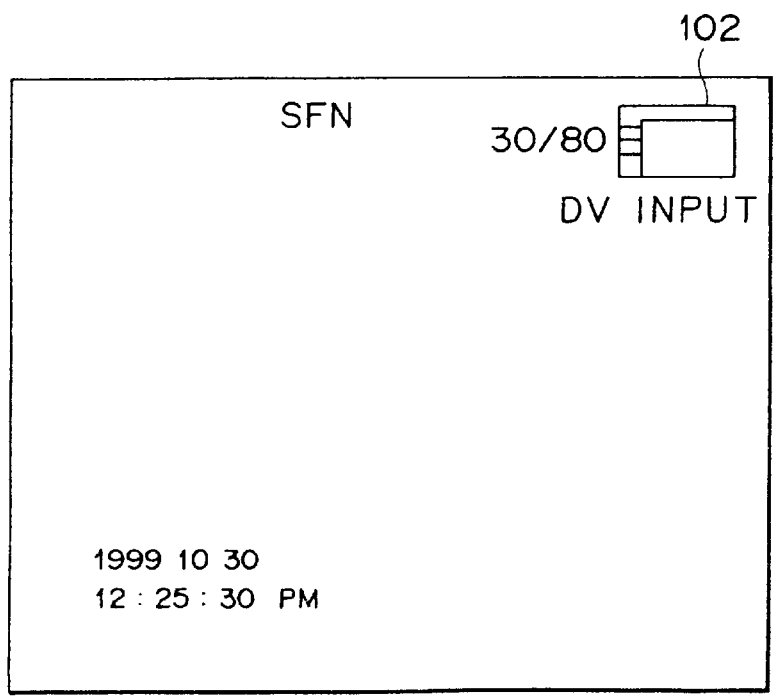
FIG. 17 is an explanatory diagram showing a still further typical screen displayed by the signal conversion apparatus on the monitor.

FIG. 17 is an explanatory diagram showing a typical screen which is displayed by the signal conversion apparatus 1 on the monitor 5 when the recording button 21 is pressed to store data of a still picture included in digital video data into a PC card 9 mounted on the PC-card connector 12. In addition, the signal conversion apparatus 1 also displays the icon 102 of the PC card 9 on the right side of the top of the screen on the monitor 5 and a message saying: "DV Input" is displayed beneath the icon 102.

The signal conversion apparatus 1 also displays a typical string of characters "30/80" on the left side of the icon 102 of the PC card 9 on the screen of the monitor 5 to indicate a picture storing state of the PC card 9 mounted on the PC-card connector 12. The numbers on the right-hand and left-hand sides of the slash "/" in the string of characters have the same meanings as those shown in FIG. 16, making it unnecessary to repeat their explanation.

The signal conversion apparatus 1 also displays a string of characters "SFN" indicating a typical compression factor of the still picture at the center of the top of the screen of the monitor 5. Moreover, the signal conversion apparatus 1 also displays a date and a time, at which the still picture data was stored in the PC card 9, on the left side of the bottom of the screen on the monitor 5. It should be noted, however, that the signal conversion apparatus 1 can also be set so that such a date and a time are not displayed.

Figure 18:
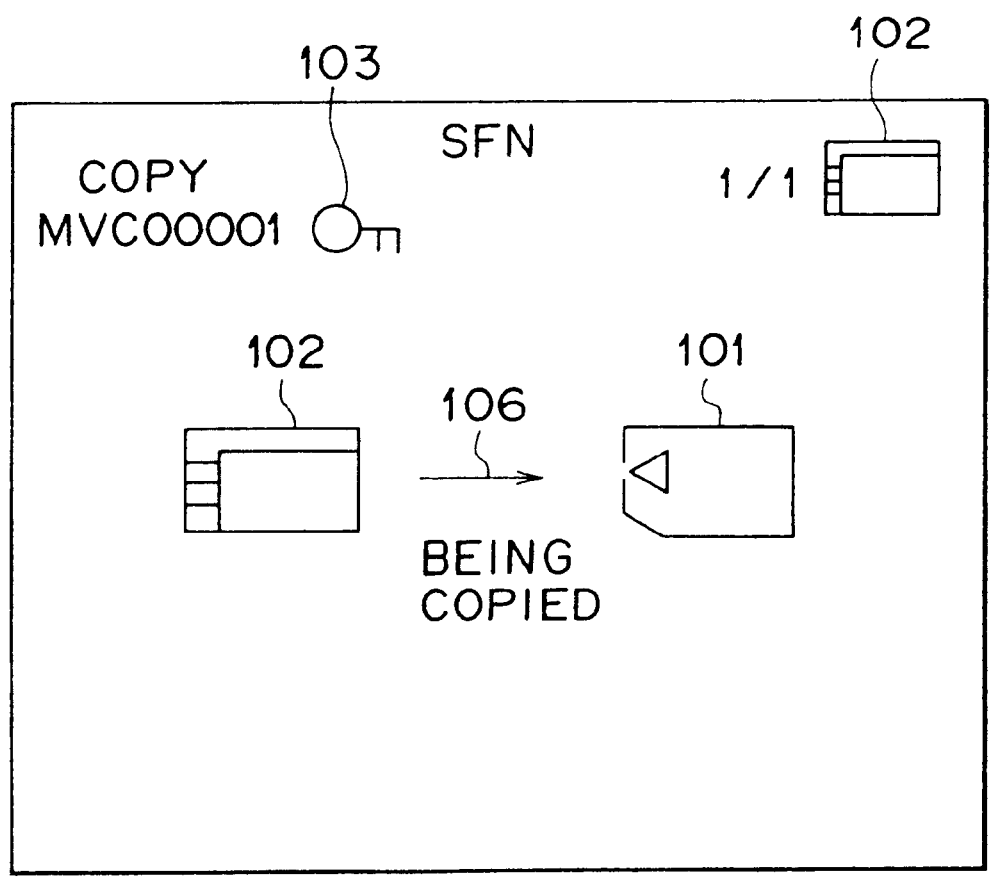
FIG. 18 is an explanatory diagram showing a still further typical screen displayed by the signal conversion apparatus on the monitor.

FIG. 18 is an explanatory diagram showing a typical screen which is displayed by the signal conversion apparatus 1 on the monitor 5 when a file of a still picture is copied to a memory stick 10 mounted on the memory-stick connector 13 from a PC card 9 mounted on the PC-card connector 12. The signal conversion apparatus 1 also displays an icon 101 of the memory stick 10 mounted on the memory-stick connector 13, an icon 102 of the PC card 9 mounted on the PC-card connector 12 at the center of the screen of the monitor 5 and an icon 106 indicating that a file of a still picture is being copied to the memory stick 10 from the PC card 9.

Figure 19:
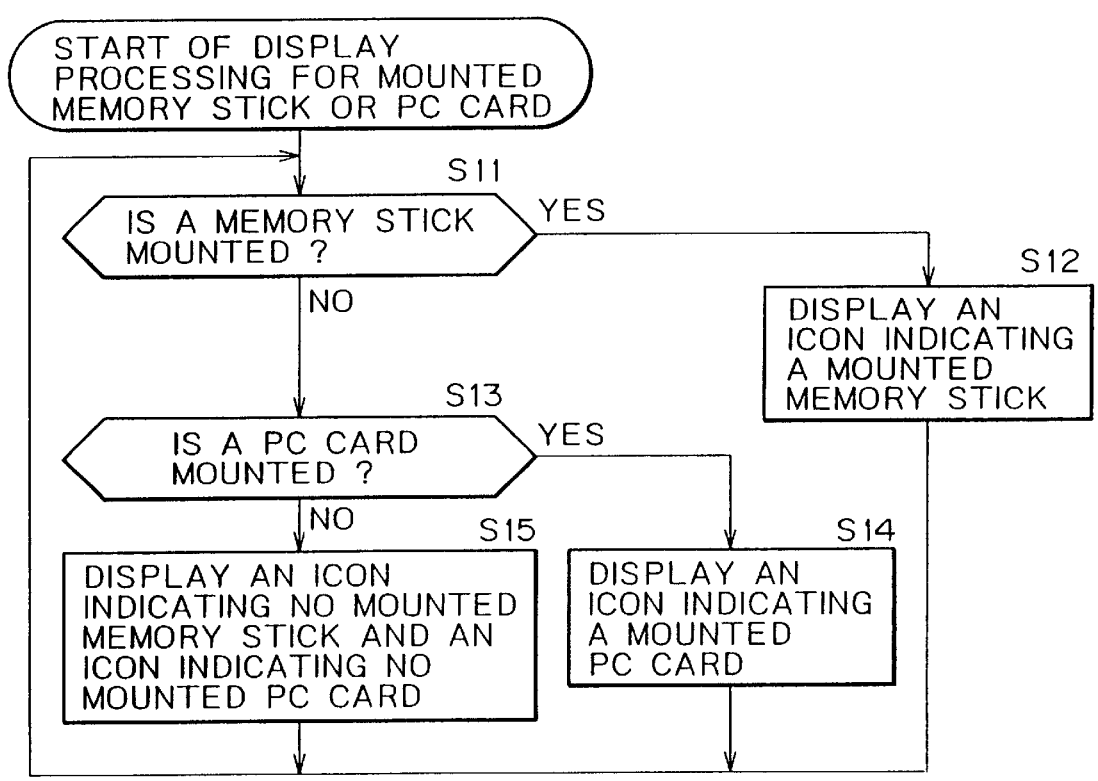
FIG. 19 shows a flowchart representing processing carried out by the signal conversion apparatus to display an icon of a memory stick mounted on the memory-stick connector or an icon of a PC card mounted on the PC-card connector.

The following description explains processing which is carried out by the control unit 67 employed in the signal conversion apparatus 1 to display an icon 101 of the memory stick 10 mounted on the memory-stick connector 13 or an icon 102 of the PC card 9 mounted on the PC-card connector 12 on the screen of the monitor 5 when the playback button 24 or the index button 23 is pressed respectively with reference to a flowchart shown in FIG. 19. As shown in the figure, the flowchart begins with a step S11 at which the control unit 67 determines whether or not a memory stick 10 is mounted on the memory-stick connector 13 on the basis of a signal supplied by the memory-stick interface 66. If a result of the determination of the step S11 indicates that a memory stick 10 has been mounted on the memory-stick connector 13, the flow of the processing goes on to a step S12 at which the control unit 67 drives the superimpose unit 68 to display an icon 101 of the memory stick 10. The flow of the processing then goes back to the step S11 to repeat the processing to display an icon.

If a result of the determination of the step S11 indicates that a memory stick 10 is not mounted on the memory-stick connector 13, on the other hand, the flow of the processing goes on to a step S13 at which the control unit 67 determines whether or not a PC card 9 is mounted on the PC-card connector 12 on the basis of a signal supplied by the PC-card interface 65. If a result of the determination of the step S13 indicates that a PC card 9 has been mounted on the PC-card connector 12, the flow of the processing goes on to a step S14 at which the control unit 67 drives the superimpose unit 68 to display an icon 102 of the PC card 9. The flow of the processing then goes back to the step S11 to repeat the processing to display an icon.

If a result of the determination of the step S13 indicates that a PC card 9 is not mounted on the PC-card connector 12, on the other hand, the flow of the processing goes on to a step S15 at which the control unit 67 drives the superimpose unit 68 to display an icon 104 indicating that no memory stick is mounted on the memory-stick connector 13 and an icon 105 indicating that no PC card is mounted on the PC-card connector 12. This is because neither memory stick is mounted on the memory-stick connector 13 nor PC card is mounted on the PC-card connector 12. The flow of the processing then goes back to the step S11 to carry out the processing to display an icon repeatedly till either a memory stick 10 is mounted on the memory-stick connector 13 or a PC card 9 is mounted on the PC-card connector 12.

As described above, an icon 101 of the memory stick 10 mounted on the memory-stick connector 13 or an icon 102 of the PC card 9 mounted on the PC-card connector 12 is displayed by the signal conversion apparatus 1 on the screen of the monitor 5 when the playback button 24 or the index button 23 is pressed respectively.

Figure 20:
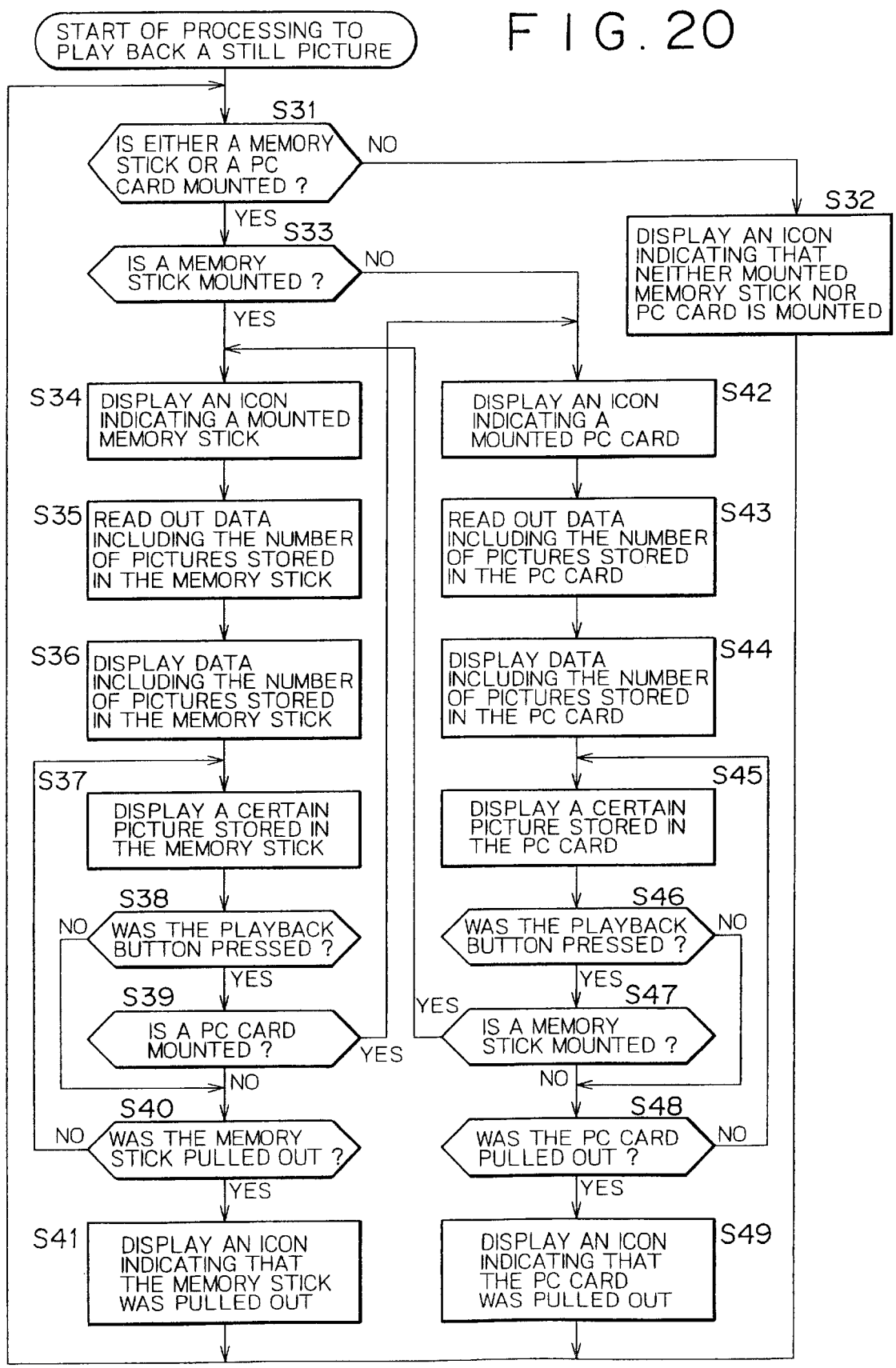
FIG. 20 shows a flowchart representing processing carried out by the signal conversion apparatus to play back a still picture from a memory stick or a PC card.

The following description explains processing which is carried out by the control unit 67 employed in the signal conversion apparatus 1 to display a picture stored in the memory stick 10 mounted on the memory-stick connector 13 or the PC card 9 mounted on the connector 1 with reference to a flowchart shown in FIG. 20. As shown in the figure, the flowchart begins with a step S31 at which the control unit 67 determines whether or not a memory stick 10 is mounted on the memory-stick connector 13 on the basis of a signal supplied by the memory-stick interface 66 or a PC card 9 is mounted on the PC-card connector 12 on the basis of a signal supplied by the PC-card interface 65. If a result of the determination indicates that neither a memory stick 10 is mounted on the memory-stick connector 13 nor a PC card 9 is mounted on the PC-card connector 12, the flow of the processing goes on to a step S32 at which the control unit 67 drives the superimpose unit 68 to display an icon 104 indicating that no memory stick is mounted on the memory-stick connector 13 and an icon 105 indicating that no PC card is mounted on the PC-card connector 12. The flow of the processing then goes back to the step S31 to carry out the processing repeatedly till either a memory stick 10 is mounted on the memory-stick connector 13 or a PC card 9 is mounted on the PC-card connector 12.

If a result of the determination of the step S31 indicates that either a memory stick 10 is mounted on the memory-stick connector 13 or a PC card 9 is mounted on the PC-card connector 12, on the other hand, the flow of the processing goes on to a step S33 at which the control unit 67 employed in the signal conversion apparatus 1 determines whether or not a memory stick 10 is mounted on the memory-stick connector 13 on the basis of a signal supplied by the memory-stick interface 66. If a result of the determination of the step S33 indicates that a memory stick 10 is mounted on the memory-stick connector 13, the flow of the processing goes on to a step S34 at which the control unit 67 drives the superimpose unit 68 to display an icon 101 indicating that a memory stick 10 is mounted on the memory-stick connector 13.

At a step S35, the control unit 67 employed in the signal conversion apparatus 1 drives the memory-stick interface 66 to read out data such as the number of pictures stored in the memory stick 10 mounted on the memory-stick connector 13 and the compression factor of the pictures from the memory stick 10. At a step S36, the control unit 67 employed in the signal conversion apparatus 1 drives the superimpose unit 68 to display information such as the number of pictures stored in the memory stick 10 and a string of characters representing the compression factor of the pictures on the screen of the monitor 5.

At a step S37, the control unit 67 employed in the signal conversion apparatus 1 drives the memory-stick interface 66 to read out data of a predetermined still picture stored in the memory stick 10, supplying the data to the digital-video-data/JPEG converter 64. The digital-video-data/JPEG converter 64 converts the data of the still picture with the JPEG format received from the memory-stick interface 66 into internal digital video data, supplying the internal digital video data to the digital-video-data/analog converter 63. The digital-video-data/analog converter 63 converts the internal digital video data received from the digital-video-data/JPEG converter 64 into an analog video signal, supplying the signal to the monitor 5. The monitor 5 displays a still picture represented by the signal.

At a step S38, the control unit 67 employed in the signal conversion apparatus 1 determines whether the playback button 24 of the key input unit 71 has been pressed on the basis of a signal received from the key input unit 71. If a result of the determination of the step S38 indicates that the playback button 24 has been pressed, the flow of the processing goes on to a step S39 at which the control unit 67 determines whether or not a PC card 9 is mounted on the PC-card connector 12 on the basis of a signal supplied by the PC-card interface 65 before a picture stored on the PC card 9 can be played back.

If a result of the determination of the step S39 indicates that a PC card 9 is not mounted on the PC-card connector 12, the flow of the processing goes on to a step S40 at which the control unit 67 determines whether or not the memory stick 10 was pulled out from the memory-stick connector 13 on the basis of a signal generated by the memory-stick interface 66. If a result of the determination of the step S40 indicates that the memory stick 10 was pulled out from the memory-stick connector 13, the flow of the processing goes on to a step S41 at which the control unit 67 drives the superimpose unit 68 to display an icon 104 indicating that the memory stick 10 was pulled out from the memory-stick connector 13. The flow then goes back to the step S31 to repeat the processing to play back a picture.

If a result of the determination of the step S40 indicates that the memory stick 10 was not pulled out from the memory-stick connector 13, on the other hand, the flow of the processing goes back to the step S37 to repeat the processing to play back a picture from the memory stick 10 and display the picture on the screen of the monitor 5.

If a result of the determination of the step S38 indicates that the playback button 24 was not pressed, on the other hand, the flow of the processing goes on to the step S40, skipping the step S39. As described above, at the step S40 the control unit 67 determines whether or not the memory stick 10 was pulled out from the memory-stick connector 13 before a picture can be played back from the memory stick 10.

If a result of the determination of the step S39 indicates that a PC card 9 is mounted on the PC-card connector 12 or if a result of the determination of the step S33 indicates that a memory stick 10 is not mounted on the memory-stick connector 13 and a picture will be thus played back from a PC card 9, on the other hand, the flow of the processing goes on to a step S42 at which the control unit 67 drives the superimpose unit 68 to display an icon 102 indicating that a PC card 9 is mounted on the PC-card connector 12.

At a step S43, the control unit 67 employed in the signal conversion apparatus 1 drives the PC-card interface 65 to read out data such as the number of pictures stored in the PC card 9 and the compression factor of the pictures from the PC card 9. At a step S44, the control unit 67 employed in the signal conversion apparatus 1 drives the superimpose unit 68 to display information such as the number of pictures stored in the PC card 9 and a string of characters representing the compression factor of the pictures on the screen of the monitor 5.

At a step S45, the control unit 67 employed in the signal conversion apparatus 1 drives the PC-card interface 65 to read out data of a predetermined still picture stored in the PC card 9 mounted on the PC-card connector 12, supplying the data to the digital-video-data/JPEG converter 64. The digital-video-data/JPEG converter 64 converts the data of the still picture with the JPEG format received from the PC-card interface 65 into internal digital video data, supplying the internal digital video data to the digital-video-data/analog converter 63. The digital-video-data/analog converter 63 converts the internal digital video data received from the digital-video-data/JPEG converter 64 into an analog video signal, supplying the signal to the monitor 5. The monitor 5 displays the predetermined still picture represented by the signal.

At a step S46, the control unit 67 employed in the signal conversion apparatus 1 determines whether the playback button 24 of the key input unit 71 has been pressed on the basis of a signal received from the key input unit 71. If a result of the determination of the step S46 indicates that the playback button 24 has been pressed, the flow of the processing goes on to a step S47 at which the control unit 67 determines whether or not a memory stick 10 is mounted on the memory-stick connector 13 on the basis of a signal supplied by the memory-stick interface 66 before a picture stored in the memory stick 10 can be played back.

If a result of the determination of the step S47 indicates that a memory stick 10 is not mounted on the memory-stick connector 13, the flow of the processing goes on to a step S48 at which the control unit 67 determines whether or not the PC card 9 was pulled out from the PC-card connector 12 on the basis of a signal generated by the PC-card interface 65. If a result of the determination of the step S48 indicates that the PC card 9 was pulled out from the PC-card connector 12, the flow of the processing goes on to a step S49 at which the control unit 67 drives the superimpose unit 68 to display an icon 105 indicating that the PC card 9 was pulled out from the PC-card connector 12. The flow then goes back to the step S31 to repeat the processing to play back a picture.

If a result of the determination of the step S48 indicates that the PC card 9 was not pulled out from the PC-card connector 12, on the other hand, the flow of the processing goes back to the step S45 to repeat the processing to play back a picture from the PC card 9 and display the picture on the screen of the monitor 5.

If a result of the determination of the step S46 indicates that the playback button 24 was not pressed, on the other hand, the flow of the processing goes on to the step S48, skipping the step S47. As described above, at the step S48 the control unit 67 determines whether or not the PC card 9 was pulled out from the PC-card connector 12 before a picture can be played back from the PC card 9.

If a result of the determination of the step S47 indicates that a memory stick 10 is mounted on the memory-stick connector 13, on the other hand, the flow of the processing goes on to the step S34 to carry out processing to playback and display a still picture stored in the memory stick 10.

As described above, the signal conversion apparatus 1 is capable of displaying a still picture stored in the memory stick 10 or the PC card 9 on the monitor 5. If the playback button 24 is pressed while a still picture stored in the memory stick 10 is being displayed on the monitor 5, a still picture stored in the PC card 9 can be displayed on the monitor 5. By the same token, if the playback button 24 is pressed while a still picture stored in the PC card 9 is being displayed on the monitor 5, a still picture stored in the memory stick 10 can be displayed on the monitor 5.

In addition, by carrying out similar processing, the signal conversion apparatus 1 is capable of converting data of a still picture stored in the memory stick 10 or the PC card 9 into digital video data of the DV-VCR format and supplying the DV-VCR data to the digital VTR 3.

Figure 21:
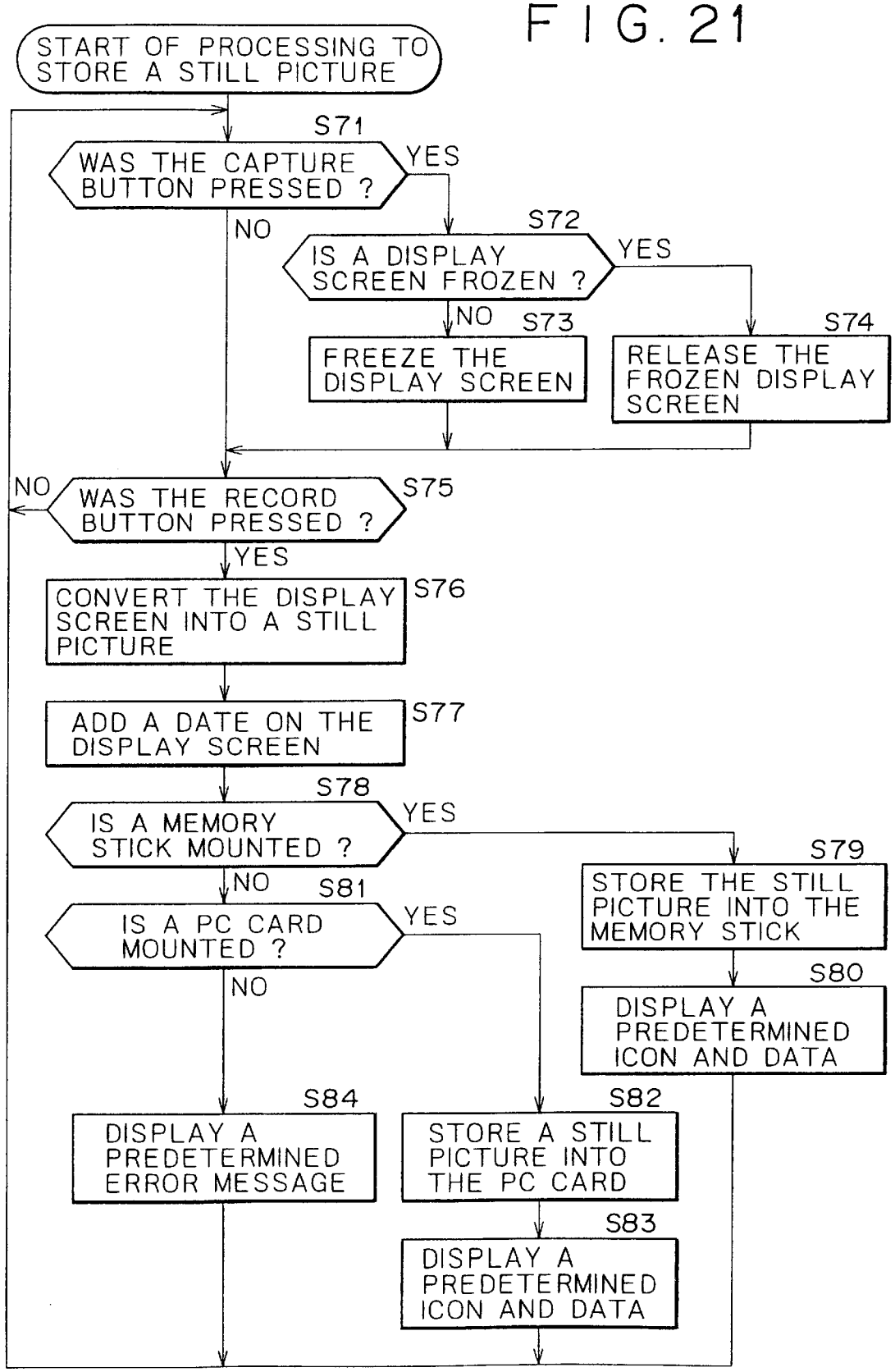
FIG. 21 shows a flowchart representing processing carried out by the signal conversion apparatus to store a still picture into a memory stick or a PC card.

The following description explains processing to store a still picture included in digital video data supplied by the digital VTR 3 or included in an analog video signal supplied by the VTR 7 into the memory stick 10 or the PC card 9 by referring to a flowchart shown in FIG. 21. As shown in the figure, the flowchart begins with a step S71 at which the control unit 67 employed in the signal conversion apparatus 1 determines whether or not the capture button 22 of the key input unit 71 has been pressed. If a result of the determination of the step S71 indicates that the capture button 22 has been pressed, the flow of the processing goes on to a step S72 to determine whether or not a still picture displayed on the monitor 5 by the digital-video-data/analog converter 63 is frozen. The picture may be included in digital video data supplied by the digital VTR 3 to the digital-video-data/analog converter 63 by way of the DV/digital-video-data converter 62 or included in an analog video signal supplied by the VTR 7 directly to the digital-video-data/analog converter 63.

If a result of the determination of the step S72 indicates that the still picture displayed on the monitor 5 by the digital-video-data/analog converter 63 is not frozen, the flow of the processing goes on to a step S73 at which the control unit 67 drives the digital-video-data/analog converter 63 or the DV/digital-video-data converter 62 to freeze the picture displayed on the monitor 5. The flow of the processing then goes on to a step S75.

If a result of the determination of the step S72 indicates that the still picture displayed on the monitor 5 by the digital-video-data/analog converter 63 is frozen, on the other hand, the flow of the processing goes on to a step S74 at which the control unit 67 drives the digital-video-data/analog converter 63 or the DV/digital-video-data converter 62 to release the frozen state of the picture displayed on the monitor 5. The flow of the processing then goes on to the step S75.

If a result of the determination of the step S71 indicates that the capture button 22 has not been pressed, on the other hand, the flow of the processing goes on directly to the step S75, skipping the steps S72 to S74.

At the step S75, the control unit 67 determines whether or not the recording button 21 of the key input unit 71 has been pressed. If a result of the determination of the step S75 indicates that the recording button 21 has been pressed, the flow of the processing goes on to a step S76 at which the control unit 67 drives the digital-video-data/JPEG converter 64 to convert internal digital video data supplied by the digital-video-data/analog converter 63 or the DV/digital-video-data converter 62 into JPEG data and to supply the JPEG data to the PC-card interface 65 and the memory-stick interface 66. At a step S77, the control unit 67 provides the PC-card interface 65 and the memory-stick interface 66 with data representing a date and a time based on date and time data supplied by the time measurement unit 69.

At a step S78, the control unit 67 determines whether or not a memory stick 10 is mounted on the memory-stick connector 13 on the basis of a signal received from the memory-stick interface 66. If a result of the determination of the step S78 indicates that a memory stick 10 is mounted on the memory-stick connector 13, the flow of the processing goes on to a step S79 at which the memory-stick interface 66 is driven by the control unit 67 to write the still picture as well as the data representing the date and the time into the memory stick 10 mounted on the memory-stick connector 13. At a step S80, the control unit 67 drives the superimpose unit 68 to display a predetermined icon and data. The flow of the processing then goes back to the step S71 to repeat the processing to store a still picture.

If a result of the determination of the step S78 indicates that a memory stick 10 is not mounted on the memory-stick connector 13, on the other hand, the flow of the processing goes on to a step S81 at which the control unit 67 determines whether or not a PC card 9 is mounted on the PC-card connector 12 on the basis of a signal received from the PC-card interface 65. If a result of the determination of the step S81 indicates that a PC card 9 is mounted on the PC-card connector 12, the flow of the processing goes on to a step S82 at which the PC-card interface 65 is driven by the control unit 67 to write the still picture as well as the data representing the date and the time into the PC card 9 mounted on the PC-card connector 12. At a step S83, the control unit 67 drives the superimpose unit 68 to display a predetermined icon and data. The flow of the processing then goes back to the step S71 to repeat the processing to store a still picture.

If a result of the determination of the step S81 indicates that a PC card 9 is not mounted on the PC-card connector 12, on the other hand, the flow of the processing goes on to a step S84 at which the control unit 67 drives the superimpose unit 68 to display a predetermined error message indicating that data can not be stored in the memory stick 10 or the PC card 9. The flow of the processing then goes back to the step S71 to repeat the processing to store a still picture.

If a result of the determination of the step S75 indicates that the recording button 21 has not been pressed, on the other hand, the flow of the processing goes back to the step S71 to repeat the processing to store a still picture.

As described above, by operation of the capture button 22, the signal conversion apparatus 1 is capable of freezing a picture displayed on the monitor 5. If the recording button 21 is pressed but the capture button 22 is not, the signal conversion apparatus 1 is capable of storing a still picture into either the memory stick 10 or the PC card 9 without freezing the picture displayed on the monitor 5.

Thus, if the VTR 7 is connected to a terminal of the signal conversion apparatus 1 for outputting an analog video signal, replacing the monitor 5, for example, the signal conversion apparatus 1 converts digital video data received from the digital VTR 3 into an analog video signal and the VTR 7 records the signal into a tape mounted on the VTR 7. At that time, if the recording button 21 is pressed, the signal conversion apparatus 1 is capable of storing a still picture into the memory stick 10 or the PC card 9 without affecting a picture being recorded by the VTR 7.

The following description explains processing to copy data of a still picture stored in the memory stick 10 to the PC card 9 with reference to a flowchart shown in FIG. 22. As shown in the figure, the flowchart begins with a step S101 at which the user mounts a memory stick 10 containing data of a still picture to be copied on the memory-stick connector 13 to play back the picture. At a step S102, the control unit 67 employed in the signal conversion apparatus 1 determines whether or not the copy button on the remote controller 2 has been pressed on the basis of a signal generated by the reception unit 72. If a result of the determination of the step S102 indicates that the copy button on the remote controller 2 has not been pressed, the flow of the processing goes back to the step S101. The processing of the steps S101 and S102 is carried out repeatedly till the copy button on the remote controller 2 is pressed.

If a result of the determination of the step S102 indicates that the copy button on the remote controller 2 has been pressed, on the other hand, the flow of the processing goes on to a step S103 at which the control unit 67 employed in the signal conversion apparatus 1 determines whether or not a PC card 9 is mounted on the PC-card connector 12 on the basis of a signal generated by the PC-card interface 65. If a result of the determination of the step S103 indicates that a PC card 9 is mounted on the PC-card connector 12, the flow of the processing goes on to a step S104 at which the control unit 67 employed in the signal conversion apparatus 1 drives the superimpose unit 68 to display a screen for confirmation of a copy operation.

At a step S105, the control unit 67 employed in the signal conversion apparatus 1 determines whether or not the copy button of the remote controller 2 has been pressed on the basis of a signal supplied by the reception unit 72. If a result of the decision of the step S105 indicates that the copy button of the remote controller 2 has been pressed, the flow of the processing goes on to a step S106 at which the control unit 67 drives the memory-stick interface 66 to read out data of a picture being played back from the memory stick 10 mounted on the memory-stick connector 13 and drives the PC-card interface 65 to write the data into the PC card 9 mounted on the PC-card connector 12.

At a step S107, the control unit 67 employed in the signal conversion apparatus 1 drives the superimpose unit 68 to display an icon indicating the ongoing copy operation shown in FIG. 18. The flow of the processing then goes back to the step S101 to repeat the copy processing.

If a result of the decision of the step S105 indicates that the copy button of the remote controller 2 has not been pressed, on the other hand, the flow of the processing goes on to a step S108 at which the control unit 67 employed in the signal conversion apparatus 1 determines whether or not a button of the remote controller 2 other than the copy button has been pressed on the basis of a signal supplied by the reception unit 72. If a result of the determination of the step S108 indicates that a button of the remote controller 2 other than the copy button has not been pressed, the flow of the processing goes back to the step S105 since no button of the remote controller 2 has been pressed. The processing starting from the step S105 is carried out repeatedly till the remote controller 2 is operated.

If a result of the determination of the step S108 indicates that a button of the remote controller 2 other than the copy button has been pressed to indicate that the copy operation is canceled, on the other hand, the flow of the processing goes back to the step S101 to repeat the processing to copy data of a picture.

If a result of the determination of the step S103 indicates that a PC card 9 is not mounted on the PC-card connector 12, on the other hand, the flow of the processing goes on to a step S109 at which the control unit 67 employed in the signal conversion apparatus 1 drives the superimpose unit 68 to display a screen for urging the user to mount a PC card 9. The flow of the processing then goes back to the step S101 to repeat the copy processing.

In this way, the signal conversion apparatus 1 copies data of a still picture stored in the memory stick 10 to the PC card 9. An operation of copying data of a still picture to the memory stick 10 from the PC card 9 can be carried out in the same way as the procedure for copying data of a still picture stored in the memory stick 10 to the PC card 9. Data of a plurality of still pictures each serving as an index can also be copied.

The following description explains processing to turn on the LED 14 indicating the state of the memory stick 10 mounted on the memory-stick connector 13 by referring to a flowchart shown in FIG. 23. As shown in the figure, the flowchart begins with a step S131 at which the control unit 67 employed in the signal conversion apparatus 1 determines whether or not an error has been generated in the memory stick 10 mounted on the memory-stick connector 13 on the basis of a signal supplied by the memory-stick interface 66. If a result of the determination of the step S131 indicates that an error has been generated in the memory stick 10 mounted on the memory-stick connector 13, the flow of the processing goes on to a step S132 to put the LED 14 of the display unit 70 in a blinking state. Then, the flow of the processing goes back to the step S131 to repeat the processing.

If a result of the determination of th e step S131 indicates that an error has not been generated in the memory stick 10 mounted on the memory-stick connector 13, on the other hand, the flow of the processing goes on to a step S133 at which the control unit 67 employed in the signal conversion apparatus 1 determines whether or not data of a still picture is being written into the memory stick 10 mounted on the memory-stick connector 13 on the basis of a signal supplied by the memory-stick interface 66. If a result of the determination of the step S133 indicates that data of a still picture is being written into the memory stick 10 mounted on the memory-stick connector 13, the flow of the processing goes on to a step S134 at which the LED 14 of the display unit 70 is turned on in a red color. Then, the flow of the processing goes back t o the step S131 to repeat the processing.

If a result of the determination of the step S133 indicates that data of a still picture is not being written into the memory stick 10 mounted on the memory stick connector 13, on the other hand, the flow of the processing goes on to a step S135 at which the control unit 67 employed in the signal conversion apparatus 1 determines whether or not data of a still picture is being played back from the memory stick 10 mounted on the memory-stick connector 13. If a result of the determination of the step S135 indicates that data of a still picture is being played back from the memory stick 10 mounted on the memory-stick connector 13, the flow of the processing goes on to a step S136 at which the control unit 67 employed in the signal conversion apparatus 1 determines whether or not data of a still picture is being r ea d out from the memory stick 10 mounted on the memory-stick connector 13.

If a result of the determination of the step S136 indicates that data of a still picture is not being read out from the memory stick 10 mounted on the memory-stick connector 13, the flow of the processing goes on to a step S137 at which the LED 14 of the display unit 70 is turned on in a green color by the control unit 67 employed in the signal conversion apparatus 1. Then, the flow of the processing goes back to the step S131 to repeat the processing.

If a result of the determination of the step S136 indicates that data of a still picture is being read out from the memory stick 10 mounted on the memory-stick connector 13, on the other hand, the flow of the processing goes on to a step S138 at which the LED 14 of the display unit 70 is put in a green blinking state by the control unit 67 employed in the signal conversion apparatus 1. Then, the flow of the processing goes back to the step S131 to repeat the processing.

If a result of the determination of the step S135 indicates that data of a still picture is not being played back from the memory stick 10 mounted on the memory-stick connector 13, the flow of the processing goes on to a step S139 at which the LED 14 of the display unit 70 is turned off by the control unit 67 employed in the signal conversion apparatus 1. Then, the flow of the processing goes back to the step S131 to repeat the processing.

As described above, the control unit 67 employed in the signal conversion apparatus 1 turns on the LED 14 or puts the LED 14 in a blinking state in accordance with the state of the memory stick 10 mounted on the memory-stick connector 13. By the same token, the control unit 67 employed in the signal conversion apparatus 1 turns on the LED 17 or puts the LED 17 in a blinking state in accordance with the state of the PC card 9 mounted on the PC-card connector 12.

In the embodiment described above, a PC card 9 or a memory stick 10 is mounted on the signal conversion apparatus 1. It should be noted that other recording media such as smart media (trademark) or a compact flash (trademark) can also be used.

In addition, the signal conversion apparatus 1 inputs and outputs digital video data having a DV-VCR format as described above. It is worth noting that the digital video data can also be digital video data compressed in accordance with for example the MPEG (Moving Picture Experts Group) format. Furthermore, the digital video data can also be stored in another storage media such as a tape, a disc or a solid-state memory as well as input and output through a network or a satellite.

Moreover, during an operation to copy a still picture from a PC card 9 to a memory stick 10, the signal conversion apparatus 1 displays the icons 101, 102 and 106 at the center of the screen of the monitor 5 as described above. In an operation to copy a moving picture from the digital VTR 3 to the VTR 7, for example, the signal conversion apparatus 1 may display an icon representing the digital VTR 3, an icon representing the VTR 7 and an icon showing the direction of the copy operation of the moving picture on the right side of the top of the screen appearing on the monitor 5. In addition, in an operation to copy a still picture from a memory stick 10 to a memory stick mounted on the digital VTR 3, the signal conversion apparatus 1 may display the icons 101 and 106 and an icon representing the memory stick mounted on the digital VTR 3.

It should be noted that the control unit 67 employed in the signal conversion apparatus 1 may also drive the superimpose unit 68 to display a predetermined icon or a predetermined string of characters to represent the utilization state of the memory stick 10 in place of the LED 14.

In addition, as presentation media for providing the user with a computer program to be executed to implement the processing described above, communication media such as a network and a satellite can also be used besides a magnetic disc, a CD-ROM and a solid-state memory.

According to an information processing apparatus of the present invention, a first storage medium and a second storage medium are mounted on a first mounting means and a second mounting means respectively, and a shielding means is used for shielding and exposing the first mounting means and the second mounting means from and to the external world, wherein the shielding means has an opening for allowing the first storage medium to be removed from or mounted on the first mounting means with the shielding means put in a state of shielding the first mounting means and the second mounting means from the external world. Therefore, it is easy for the user to determine which medium is to be mounted on or removed from the apparatus and the user hardly mounts or removes a wrong medium on or from the apparatus.

What is claimed is:

1. An information processing apparatus for connecting to a first storage medium and a second storage medium, said information processing apparatus comprising:

a first mounting means, including a first mounting portion, for connecting to said first storage medium;

a second mounting means, including a second mounting portion, for connecting to said second storage medium; and a shielding means for shielding and exposing the first and second mounting portions, wherein said shielding means comprises an opening for allowing said first storage medium to be removed from or mounted on said first mounting portion while shielding said second mounting portion.

2. An information processing apparatus according to claim 1, wherein said first storage medium is a memory stick.

3. An information processing apparatus according to claim 1, wherein said second storage medium is a personal computer (PC) card.

4. An information processing apparatus for connecting to a first storage medium and a second storage medium, said information processing apparatus comprising:

a first mounting unit, including a first mounting portion, for connecting to said first storage medium;

a second mounting unit, including a second mounting portion, for connecting to said second storage medium; and a shielding unit for shielding and exposing the first and second mounting portions, wherein said shielding unit comprises an opening for allowing said first storage medium to be removed from or mounted on said first mounting portion while shielding said second mounting portion.

5. The information processing apparatus of claim 4, wherein said first storage medium is a memory stick.

6. The information processing apparatus of claim 4, wherein said second storage medium is a personal computer (PC) card.

\* \* \* \* \*